US012660649B2

(12) United States Patent
Sun et al.

(10) Patent No.: US 12,660,649 B2
(45) Date of Patent: Jun. 16, 2026

(54) PACKAGE COMPRISING A SUBSTRATE AND AN INTERCONNECTION DIE CONFIGURED FOR HIGH DENSITY INTERCONNECTION

(71) Applicant: QUALCOMM Incorporated, San Diego, CA (US)

(72) Inventors: Yangyang Sun, San Diego, CA (US); Srikanth Kulkarni, Dublin, CA (US); Lily Zhao, San Diego, CA (US); Milind Shah, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 541 days.

(21) Appl. No.: 17/741,986

(22) Filed: May 11, 2022

(65) Prior Publication Data

US 2023/0369234 A1    Nov. 16, 2023

(51) Int. Cl.
| | |
|---|---|
| *H10W 70/65* | (2026.01) |
| *H10W 70/05* | (2026.01) |
| *H10W 70/60* | (2026.01) |
| *H10W 70/69* | (2026.01) |
| *H10W 74/10* | (2026.01) |

(Continued)

(52) U.S. Cl.
CPC ......... *H10W 70/65* (2026.01); *H10W 70/095* (2026.01); *H10W 70/611* (2026.01); *H10W 70/69* (2026.01); *H10W 74/114* (2026.01); *H10W 74/121* (2026.01); *H10W 90/00* (2026.01); *H10W 74/15* (2026.01);

(Continued)

(58) Field of Classification Search
CPC ............... H01L 23/5386; H01L 21/486; H01L 23/3121; H01L 23/3135; H01L 23/49894; H01L 25/165; H01L 23/5385; H01L 24/16; H01L 24/32; H01L 24/73; H01L 2224/16227; H01L 2224/16237; H01L 2224/16238; H01L 2224/32225; H01L 2224/73204
See application file for complete search history.

(56) References Cited

U.S. PATENT DOCUMENTS

| | | | |
|---|---|---|---|
| 8,399,992 B2 | 3/2013 | Park et al. | |
| 9,230,876 B2 | 1/2016 | Lee et al. | |

(Continued)

FOREIGN PATENT DOCUMENTS

| | | |
|---|---|---|
| CN | 207834276 U | 9/2018 |
| KR | 20150137976 A | 12/2015 |
| WO | 2017058825 A1 | 4/2017 |

OTHER PUBLICATIONS ip.com search history (Year: 2026).*

(Continued)

*Primary Examiner* — Zandra V Smith
*Assistant Examiner* — Andre C Stevenson
(74) *Attorney, Agent, or Firm* — Loza & Loza, LLP

(57) ABSTRACT

A package comprising a substrate comprising a first surface and a second surface; a first integrated device coupled to the first surface of the substrate; an interconnection die coupled to the first surface of the substrate; a first encapsulation layer coupled to the first surface of the substrate, wherein the first encapsulation layer encapsulates the first integrated device and the interconnection die; and a second integrated device coupled to the second surface of the substrate.

30 Claims, 19 Drawing Sheets

*CROSS SECTIONAL PROFILE VIEW*

(51) Int. Cl.
 H10W 74/15 (2026.01)
 H10W 90/00 (2026.01)

(52) U.S. Cl.
 CPC ........ *H10W 90/401* (2026.01); *H10W 90/724* (2026.01); *H10W 90/734* (2026.01)

(56) References Cited

U.S. PATENT DOCUMENTS

| | | | |
|---|---|---|---|
| 9,385,095 | B2 | 7/2016 | Jeng et al. |
| 9,831,170 | B2 | 11/2017 | Scanlan et al. |
| 9,875,992 | B2 | 1/2018 | Heo et al. |
| 9,947,642 | B2 | 4/2018 | Kumar et al. |
| 9,978,731 | B1 | 5/2018 | Kim |
| 10,163,871 | B2 | 12/2018 | Kumar et al. |
| 10,192,855 | B2 | 1/2019 | Seo et al. |
| 10,483,187 | B2 | 11/2019 | Yu et al. |
| 10,529,698 | B2 | 1/2020 | Yu et al. |
| 10,566,261 | B2 | 2/2020 | Pei et al. |
| 10,825,774 | B2 | 11/2020 | Oh et al. |
| 11,075,151 | B2 | 7/2021 | Tsai et al. |
| 11,189,603 | B2 | 11/2021 | Yu et al. |
| 2005/0184377 | A1 | 8/2005 | Takeuchi et al. |
| 2012/0320536 | A1 | 12/2012 | Yamamoto |
| 2013/0187268 | A1 | 7/2013 | Lin et al. |
| 2017/0110392 | A1 | 4/2017 | Lin et al. |
| 2017/0186665 | A1 | 6/2017 | Choudhury et al. |
| 2018/0026008 | A1* | 1/2018 | Jeng ...................... H10W 90/00 257/692 |
| 2018/0061813 | A1 | 3/2018 | Hsieh et al. |
| 2018/0211944 | A1 | 7/2018 | Kim |
| 2018/0240729 | A1 | 8/2018 | Kim et al. |
| 2019/0074264 | A1 | 3/2019 | Chen et al. |
| 2019/0287947 | A1 | 9/2019 | Chen et al. |
| 2020/0083172 | A1 | 3/2020 | Hsieh et al. |
| 2020/0135613 | A1 | 4/2020 | Chen et al. |
| 2020/0273783 | A1* | 8/2020 | Sankman .............. H10W 90/00 |
| 2020/0303329 | A1* | 9/2020 | Elsherbini ............ H10W 44/20 |
| 2020/0343151 | A1 | 10/2020 | Nomura et al. |
| 2020/0350274 | A1 | 11/2020 | Tang et al. |
| 2020/0411464 | A1 | 12/2020 | Mallik et al. |
| 2021/0098421 | A1 | 4/2021 | Wu et al. |
| 2021/0280507 | A1 | 9/2021 | Aldrete |
| 2023/0317677 | A1* | 10/2023 | Song ................... H01L 21/4853 257/668 |
| 2023/0351577 | A1* | 11/2023 | Chen ..................... G06T 7/0004 |

OTHER PUBLICATIONS

International Search Report and Written Opinion—PCT/US2023/019661—ISA/EPO—Oct. 4, 2023.
Taiwan Search Report—TW110106914—TIPO—Aug. 1, 2024.
Partial International Search Report—PCT/US2023/019661—ISA/EPO—Aug. 10, 2023.

* cited by examiner

CROSS SECTIONAL PROFILE VIEW

CROSS SECTIONAL PROFILE VIEW

DIE SUBSTRATE
CAVITY ETCHING
PLATING
POLISH
110
302    110
305    110
305    110
*FIG. 3A*

FRONT SIDE INTERCONNECT

DIE SUBSTRATE THINNING

BACK SIDE INTERCONNECT

SINGULATION

DIE SUBSTRATE
CAVITY ETCHING
CONDUCTIVE MATERIAL FILL IN
POLISH
110
110
402
110
405
110
405
110
*FIG. 4A*

500

PROVIDE DIE SUBSTRATE — 505

FORM CAVITIES IN THE DIE SUBSTRATE — 510

FORM CONDUCTIVE MATERIAL (E.G., PLATING, CONDUCTIVE FILL) IN THE CAVITIES — 515

FORM FRONT SIDE INTERCONNECTS — 520

THIN DIE SUBSTRATE — 525

FORM BACK SIDE INTERCONNECTS (OPTIONAL) — 530

SINGULATION INTERCONNECTION DIES — 535

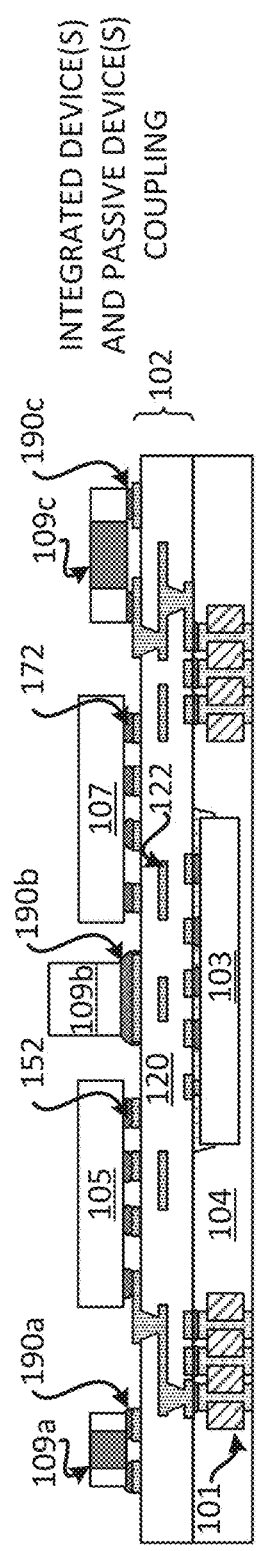
INTEGRATED DEVICE(S) AND PASSIVE DEVICE(S) COUPLING
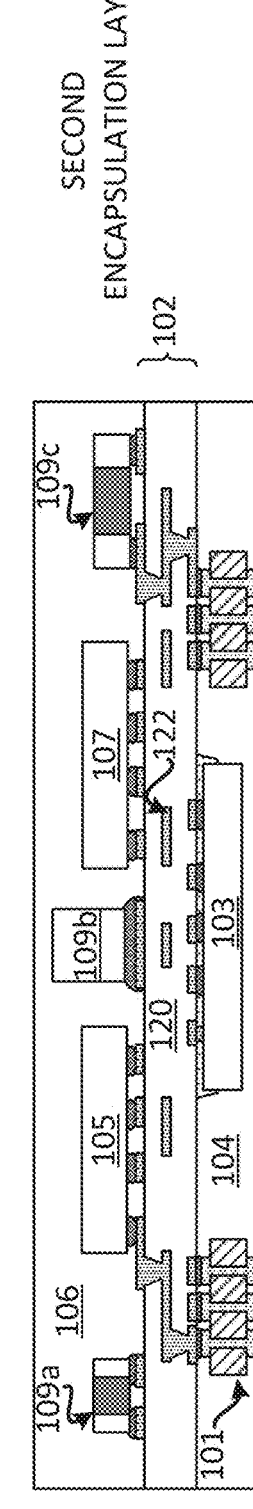
SECOND ENCAPSULATION LAYER
*FIG. 6B*

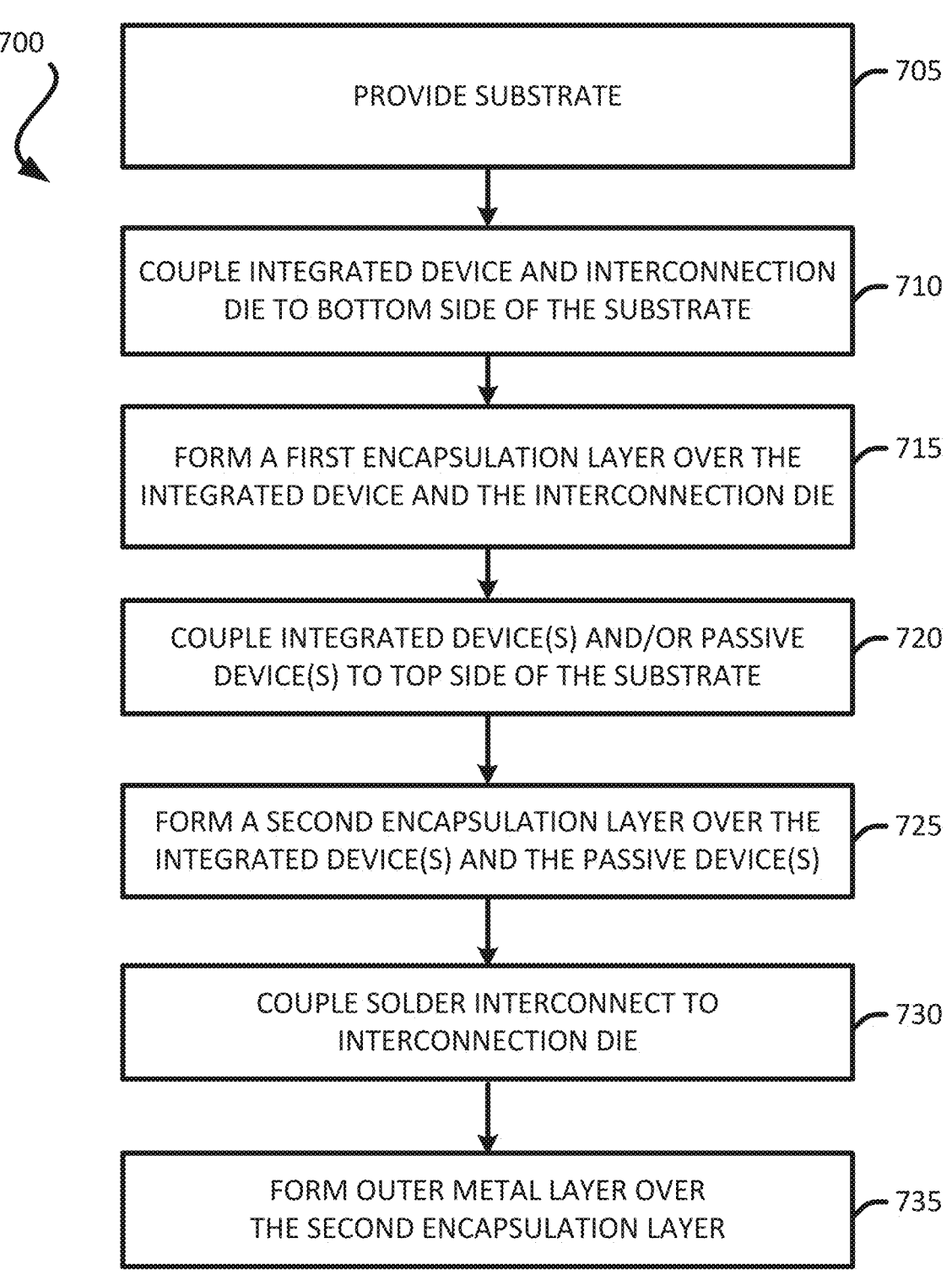

700

705 — PROVIDE SUBSTRATE

710 — COUPLE INTEGRATED DEVICE AND INTERCONNECTION DIE TO BOTTOM SIDE OF THE SUBSTRATE

715 — FORM A FIRST ENCAPSULATION LAYER OVER THE INTEGRATED DEVICE AND THE INTERCONNECTION DIE

720 — COUPLE INTEGRATED DEVICE(S) AND/OR PASSIVE DEVICE(S) TO TOP SIDE OF THE SUBSTRATE

725 — FORM A SECOND ENCAPSULATION LAYER OVER THE INTEGRATED DEVICE(S) AND THE PASSIVE DEVICE(S)

730 — COUPLE SOLDER INTERCONNECT TO INTERCONNECTION DIE

735 — FORM OUTER METAL LAYER OVER THE SECOND ENCAPSULATION LAYER

*FIG. 7*

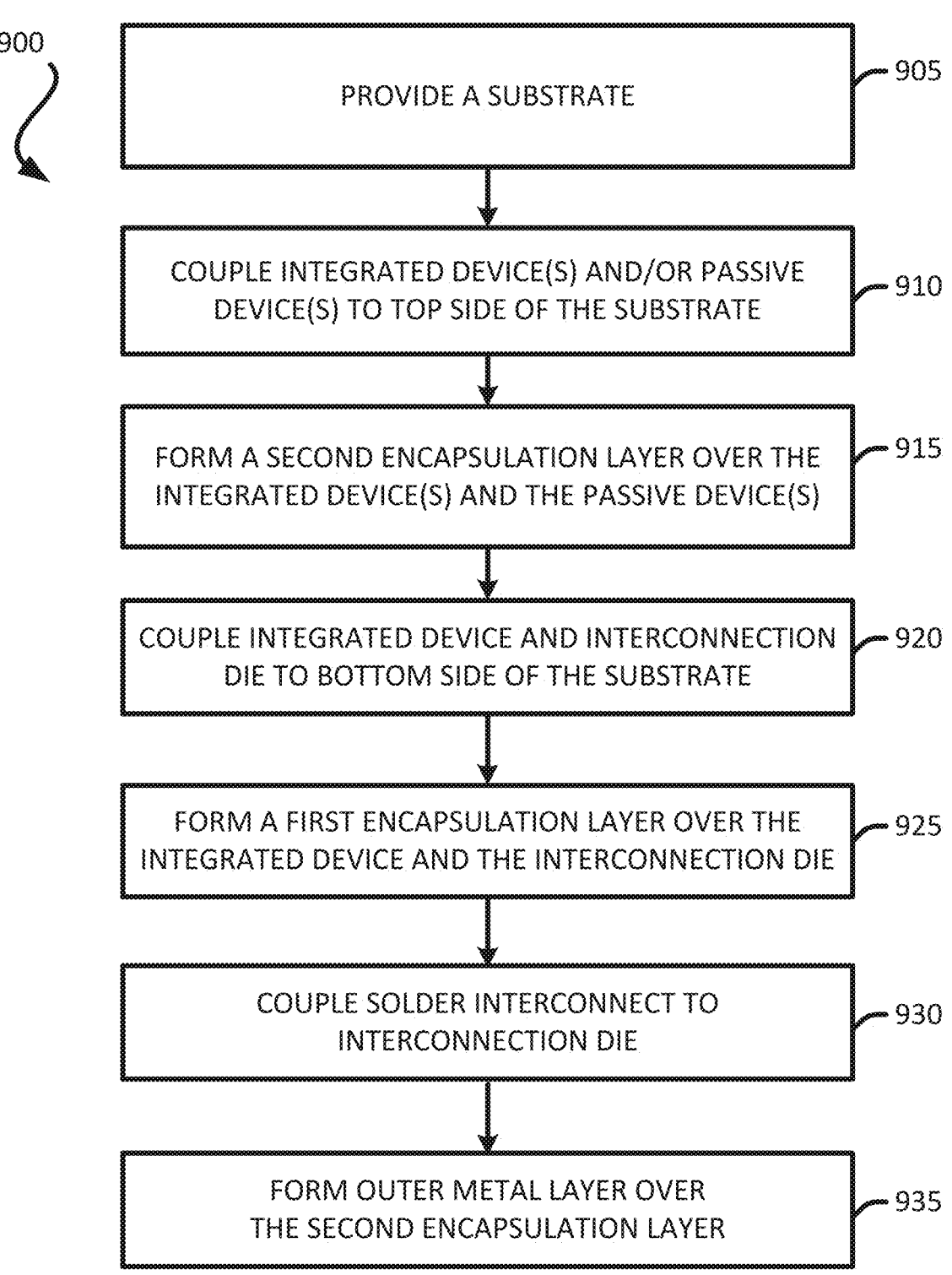

900

PROVIDE A SUBSTRATE — 905

COUPLE INTEGRATED DEVICE(S) AND/OR PASSIVE DEVICE(S) TO TOP SIDE OF THE SUBSTRATE — 910

FORM A SECOND ENCAPSULATION LAYER OVER THE INTEGRATED DEVICE(S) AND THE PASSIVE DEVICE(S) — 915

COUPLE INTEGRATED DEVICE AND INTERCONNECTION DIE TO BOTTOM SIDE OF THE SUBSTRATE — 920

FORM A FIRST ENCAPSULATION LAYER OVER THE INTEGRATED DEVICE AND THE INTERCONNECTION DIE — 925

COUPLE SOLDER INTERCONNECT TO INTERCONNECTION DIE — 930

FORM OUTER METAL LAYER OVER THE SECOND ENCAPSULATION LAYER — 935

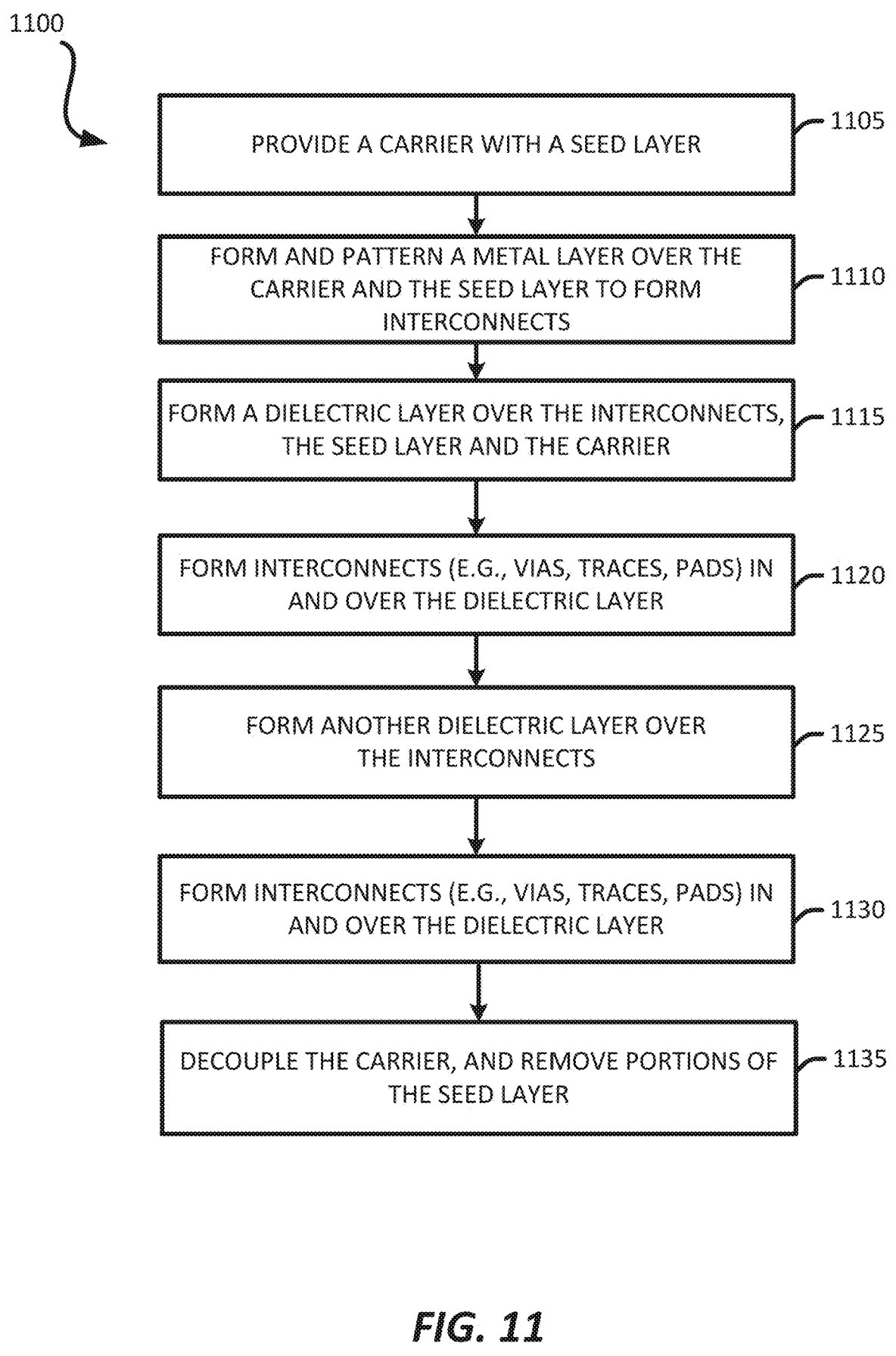

| | |
|---|---|
| PROVIDE A CARRIER WITH A SEED LAYER | 1105 |

↓

| | |
|---|---|
| FORM AND PATTERN A METAL LAYER OVER THE CARRIER AND THE SEED LAYER TO FORM INTERCONNECTS | 1110 |

↓

| | |
|---|---|
| FORM A DIELECTRIC LAYER OVER THE INTERCONNECTS, THE SEED LAYER AND THE CARRIER | 1115 |

↓

| | |
|---|---|
| FORM INTERCONNECTS (E.G., VIAS, TRACES, PADS) IN AND OVER THE DIELECTRIC LAYER | 1120 |

↓

| | |
|---|---|
| FORM ANOTHER DIELECTRIC LAYER OVER THE INTERCONNECTS | 1125 |

↓

| | |
|---|---|
| FORM INTERCONNECTS (E.G., VIAS, TRACES, PADS) IN AND OVER THE DIELECTRIC LAYER | 1130 |

↓

| | |
|---|---|
| DECOUPLE THE CARRIER, AND REMOVE PORTIONS OF THE SEED LAYER | 1135 |

*FIG. 11*

PACKAGE COMPRISING A SUBSTRATE AND AN INTERCONNECTION DIE CONFIGURED FOR HIGH DENSITY INTERCONNECTION

FIELD

Various features relate to packages with substrates and integrated devices.

BACKGROUND

A package may include a substrate and integrated devices. These components are coupled together to provide a package that may perform various electrical functions. There is an ongoing need to provide better performing packages and reduce the overall size of the packages.

SUMMARY

Various features relate to packages with substrates and integrated devices.

One example provides a package comprising a substrate comprising a first surface and a second surface; a first integrated device coupled to the first surface of the substrate; a dummy die coupled to the first surface of the substrate; a first encapsulation layer coupled to the first surface of the substrate, wherein the first encapsulation layer encapsulates the first integrated device and the dummy die; and a second integrated device coupled to the second surface of the substrate.

Another example provides a device comprising a package. The package comprises a substrate comprising a first surface and a second surface; a first integrated device coupled to the first surface of the substrate; a dummy die coupled to the first surface of the substrate; a first encapsulation layer coupled to the first surface of the substrate, wherein the first encapsulation layer encapsulates the first integrated device and the dummy die; and a second integrated device coupled to the second surface of the substrate.

Another example provides a method for fabricating a package. The method provides a substrate comprising a first surface and a second surface. The method couples a first integrated device to the first surface of the substrate. The method couples an interconnection die to the first surface of the substrate. The method couples a first encapsulation layer to the first surface of the substrate, where the first encapsulation layer encapsulates the first integrated device and the interconnection die. The method couples a second integrated device to the second surface of the substrate.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 3A-3B illustrate an exemplary sequence for fabricating an interconnection die.

FIGS. 4A-4B illustrate an exemplary sequence for fabricating an interconnection die.

2

Figure 5:
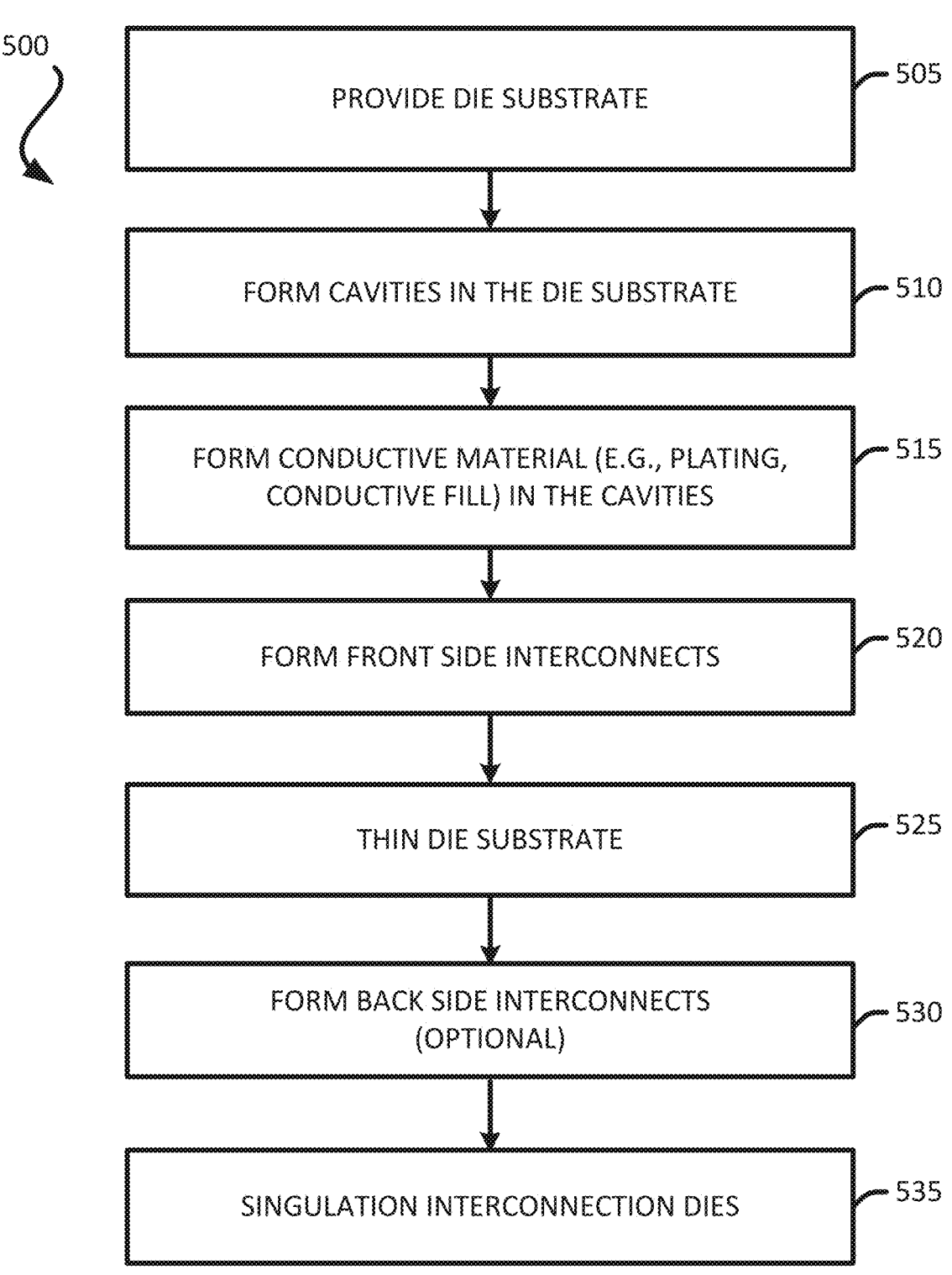

FIG. 5 illustrates an exemplary flow chart of a method for fabricating an interconnection die.

Figure 6A:
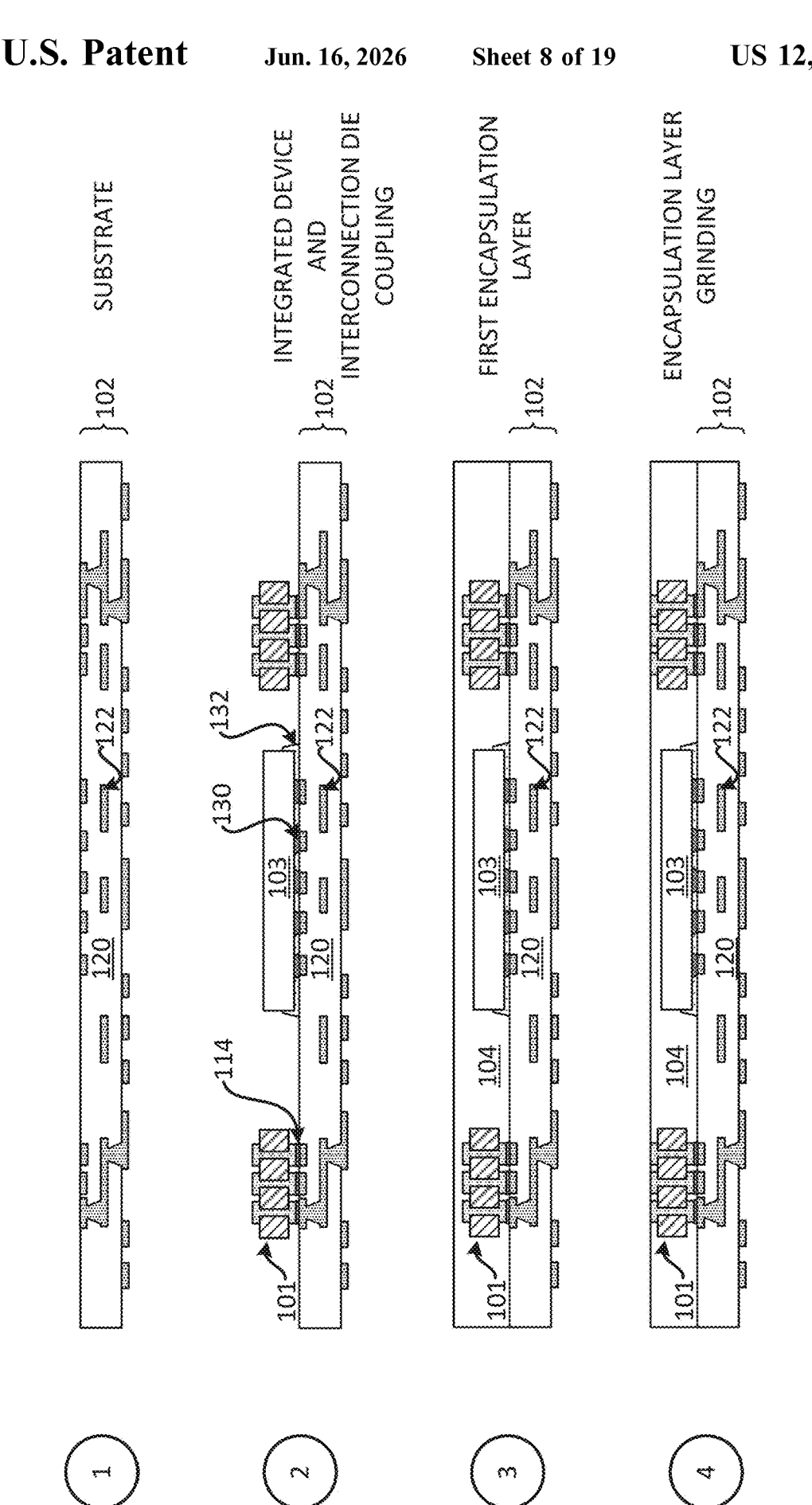
Figure 6C:
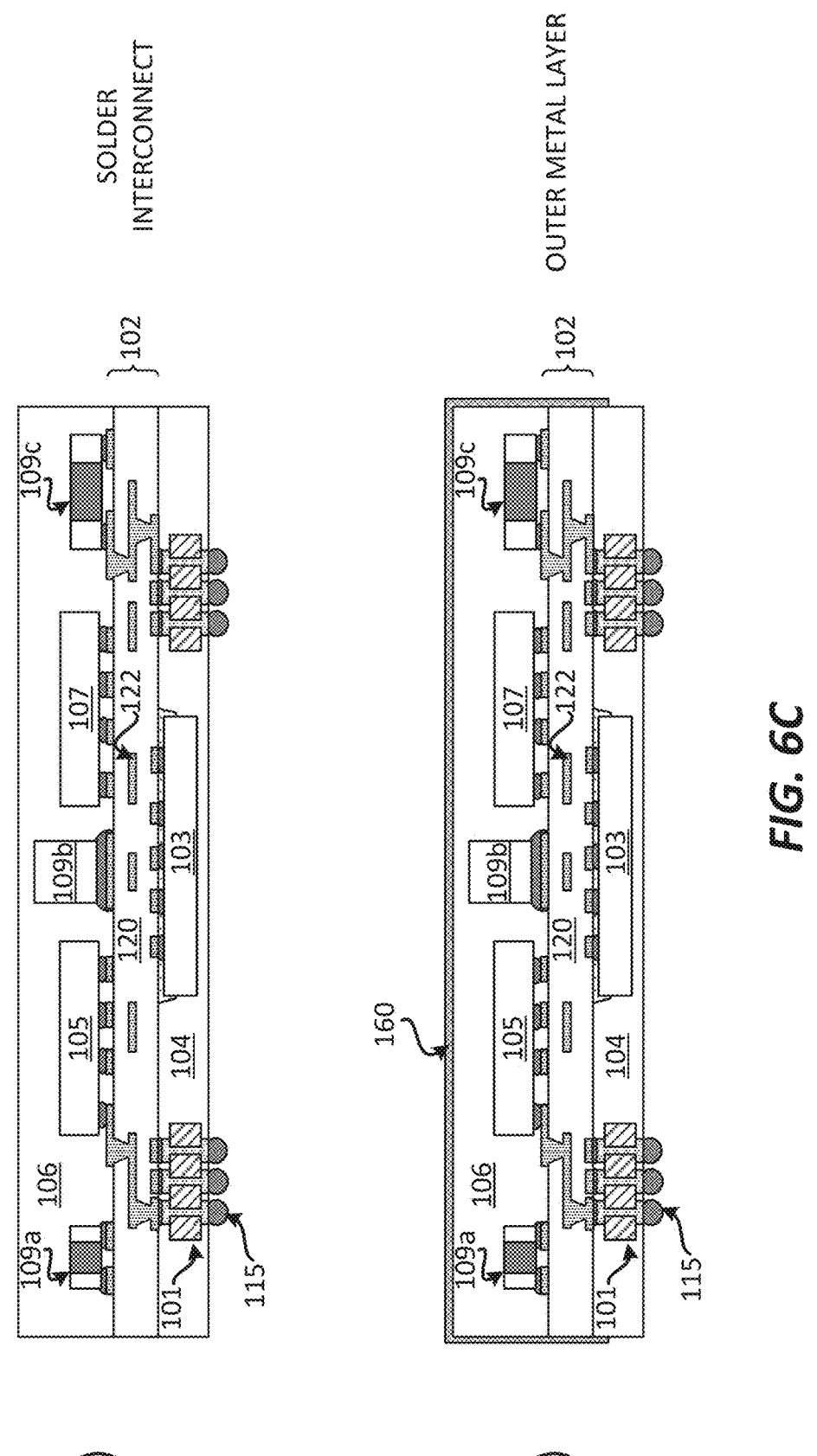

FIGS. 6A-6C illustrate an exemplary sequence for fabricating a package that includes a substrate and an interconnection die.

FIG. 7 illustrates an exemplary flow chart of a method for fabricating a package that includes a substrate and an interconnection die.

Figure 8A:
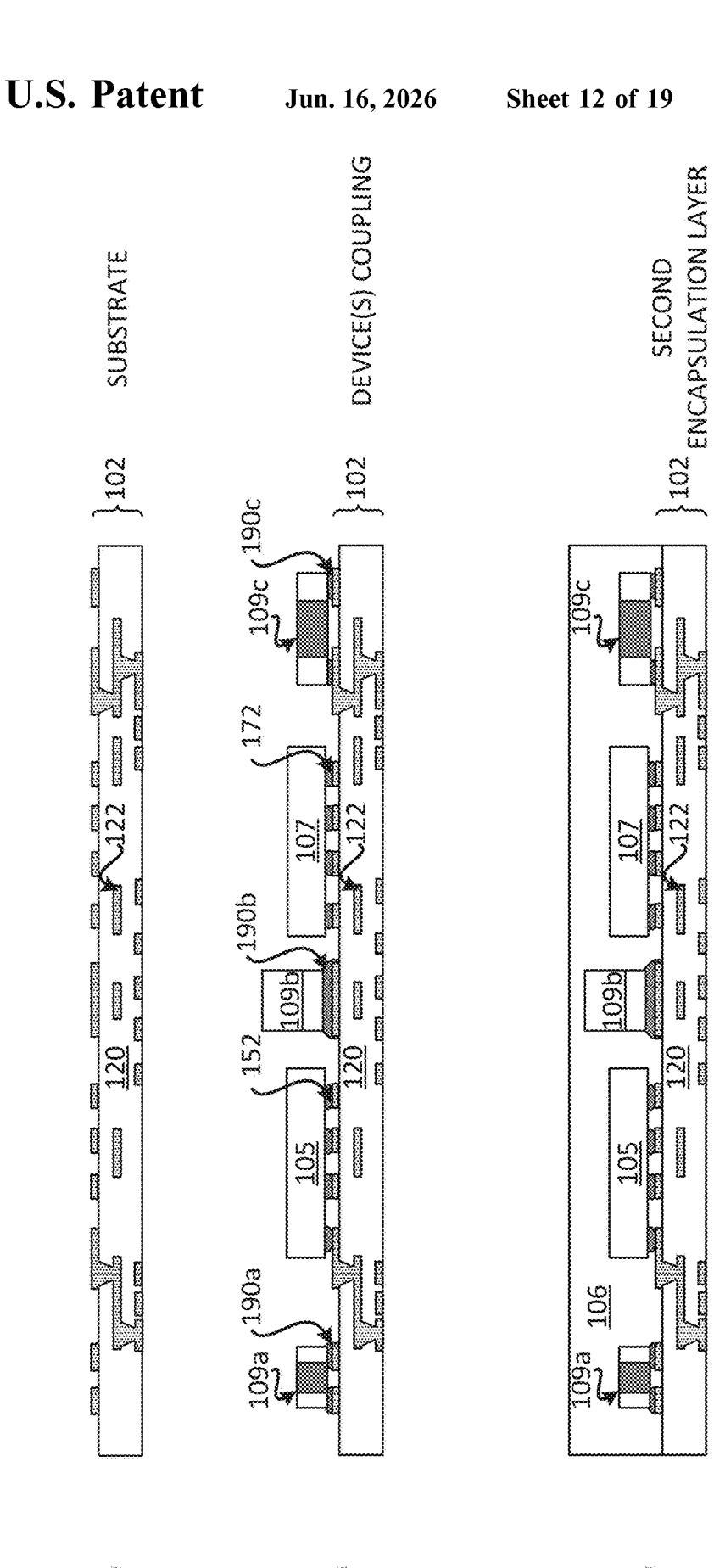
Figure 8B:
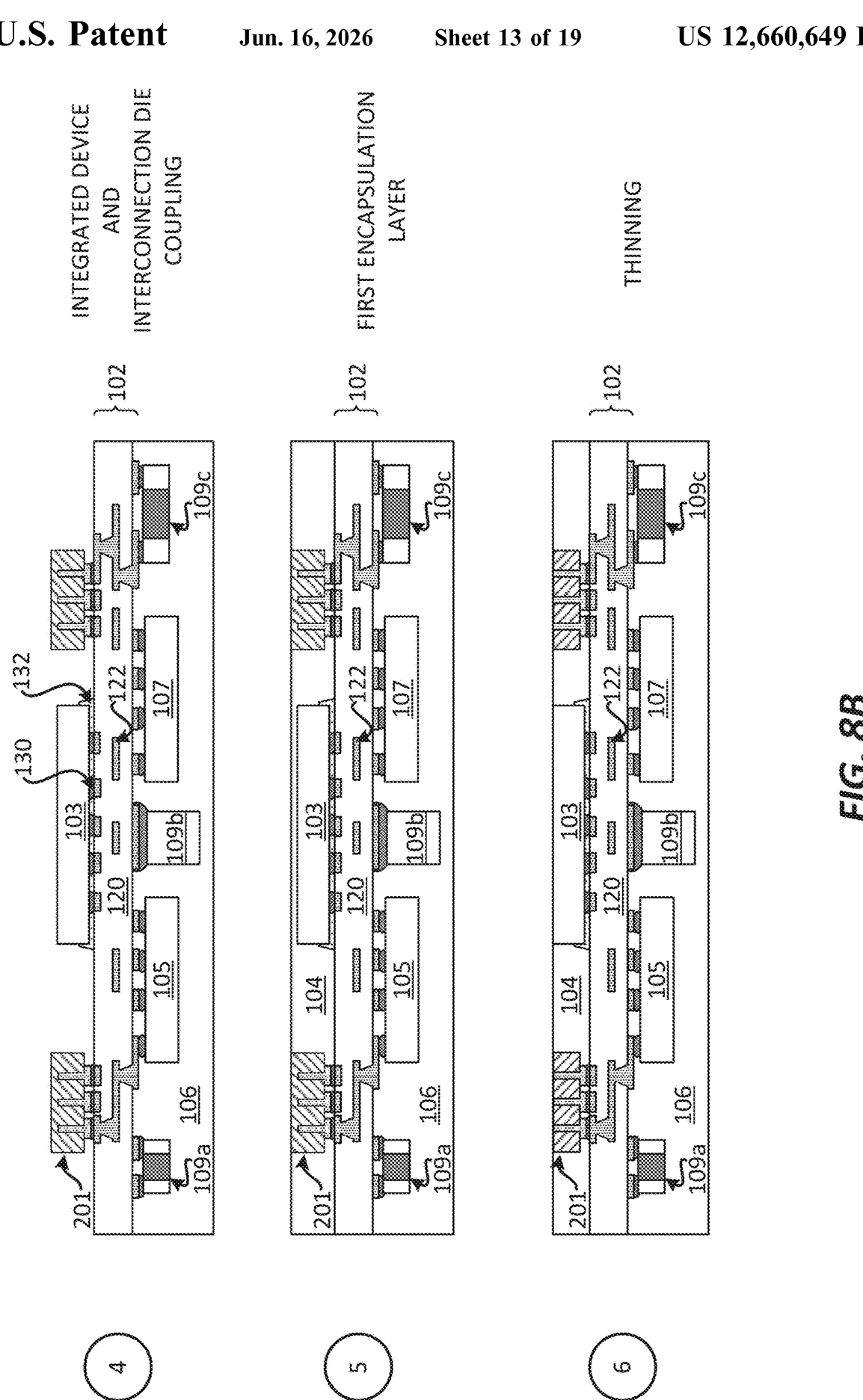
Figure 8C:
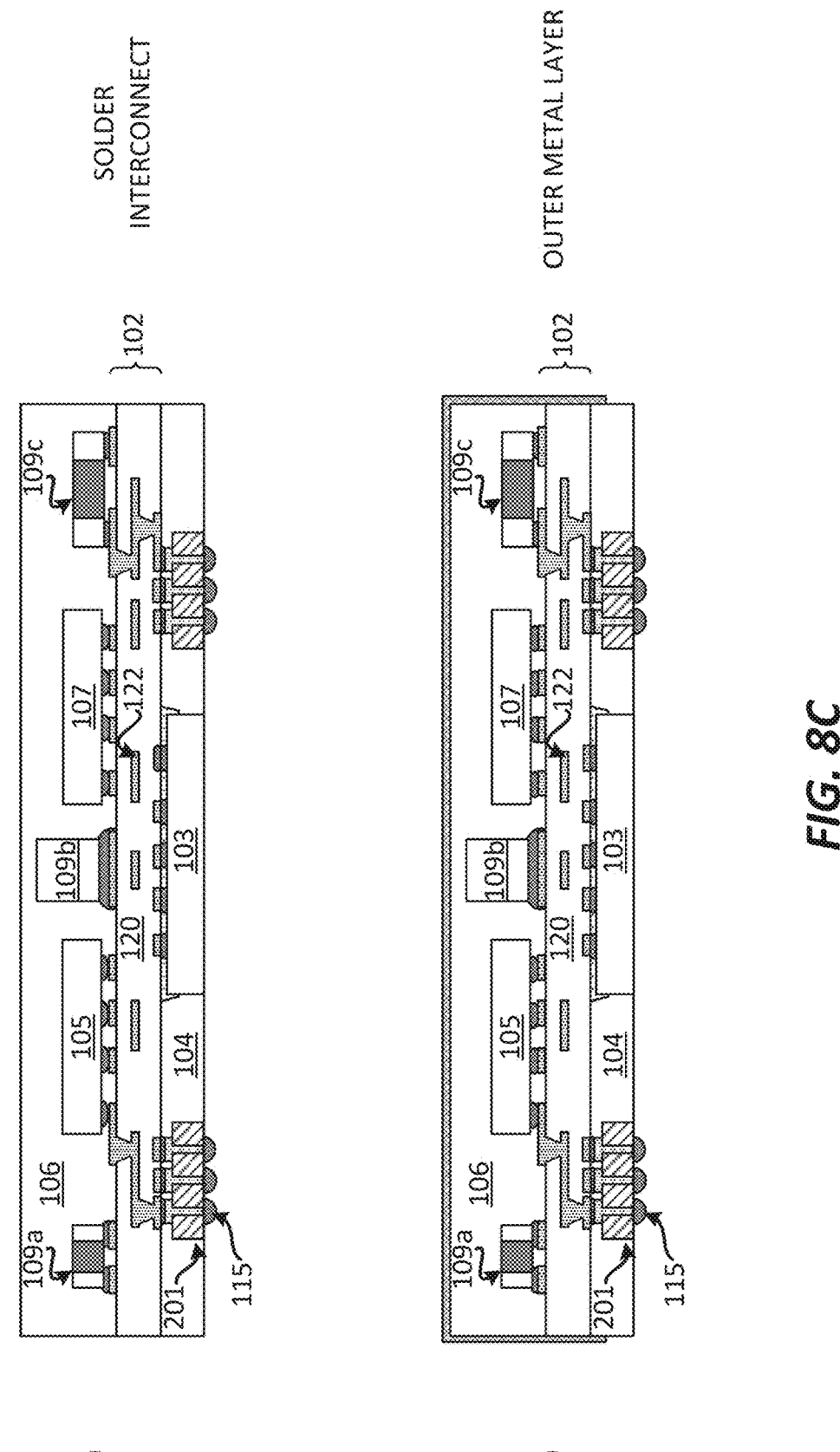

FIGS. 8A-8C illustrate an exemplary sequence for fabricating a package that includes a substrate and an interconnection die.

FIG. 9 illustrates an exemplary flow chart of a method for fabricating a package that includes a substrate and an interconnection die.

Figure 10A:
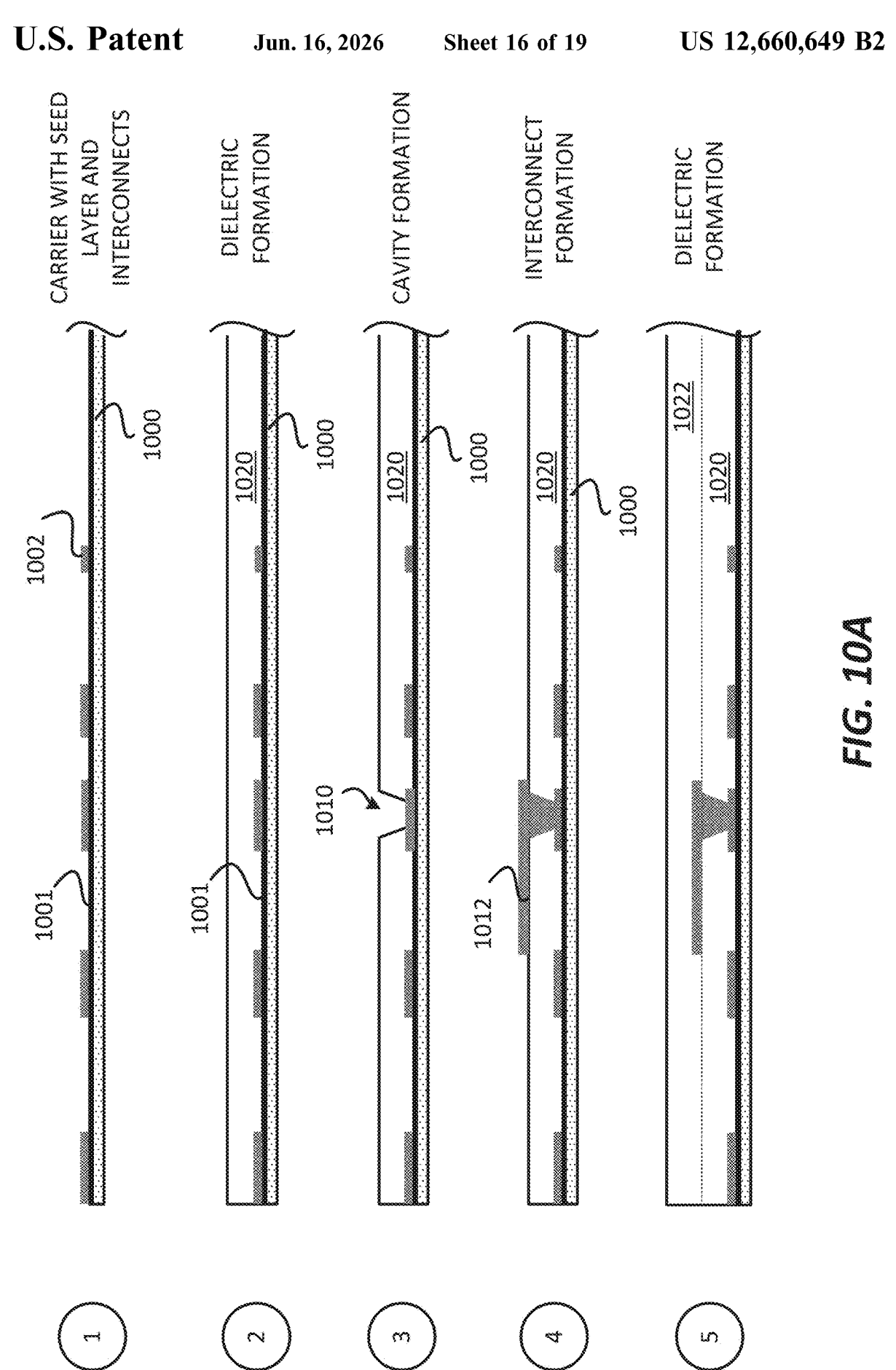
Figure 10B:
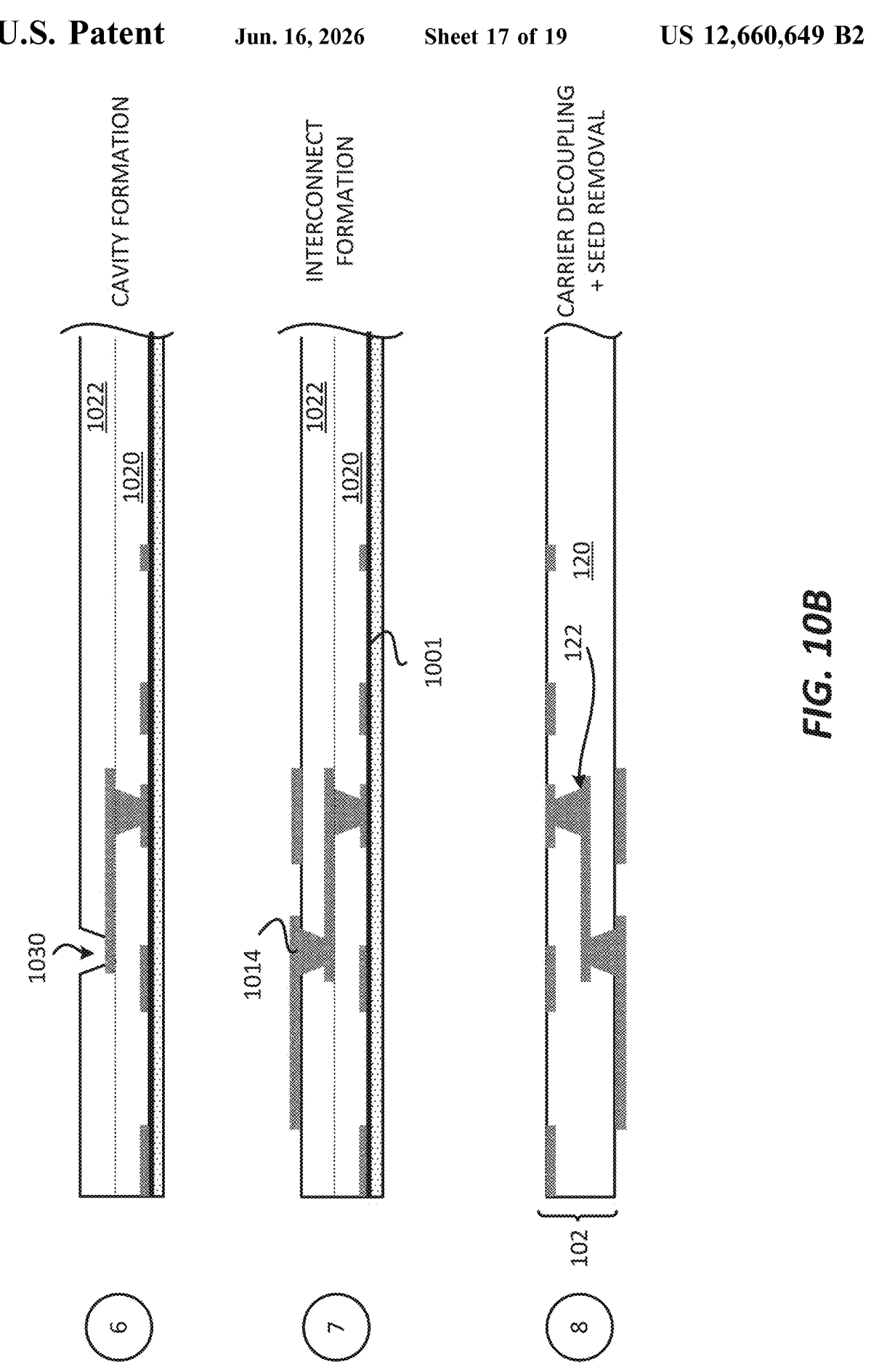

FIGS. 10A-10B illustrate an exemplary sequence for fabricating a substrate.

FIG. 11 illustrates an exemplary flow chart of a method for fabricating a substrate.

Figure 12:
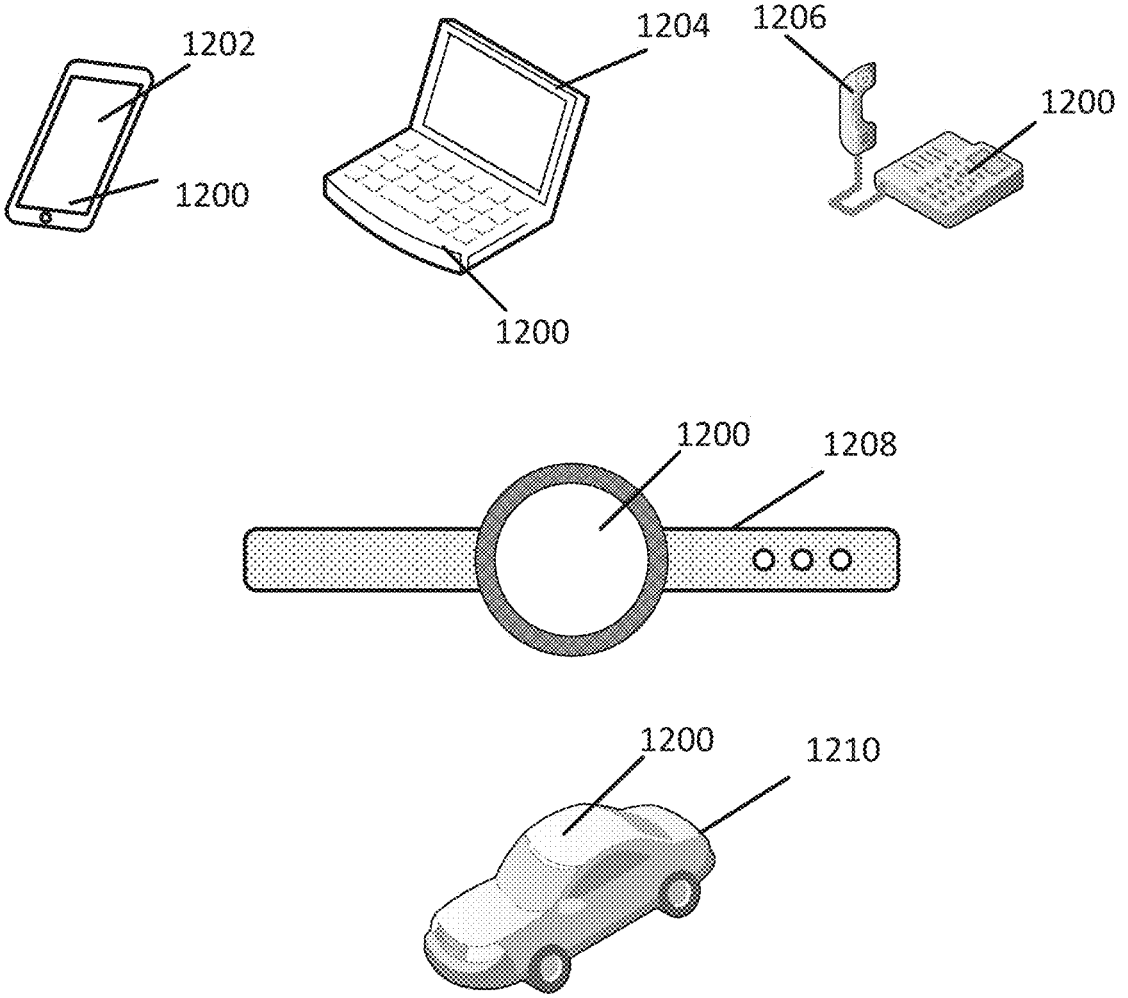

FIG. 12 illustrates various electronic devices that may integrate a die, an electronic circuit, an integrated device, an integrated passive device (IPD), a passive component, a package, and/or a device package described herein.

DETAILED DESCRIPTION

In the following description, specific details arm given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate comprising a first surface and a second surface; a first integrated device coupled to the first surface of the substrate; an interconnection die coupled to the first surface of the substrate; a first encapsulation layer coupled to the first surface of the substrate, wherein the first encapsulation layer encapsulates the first integrated device and the interconnection die; and a second integrated device coupled to the second surface of the substrate. As will be further described below, the package provides a high density interconnection which helps provide improved package performance, while keeping the package small and thin.

Exemplary Package Comprising a Substrate and an Interconnection Die

Figure 1:
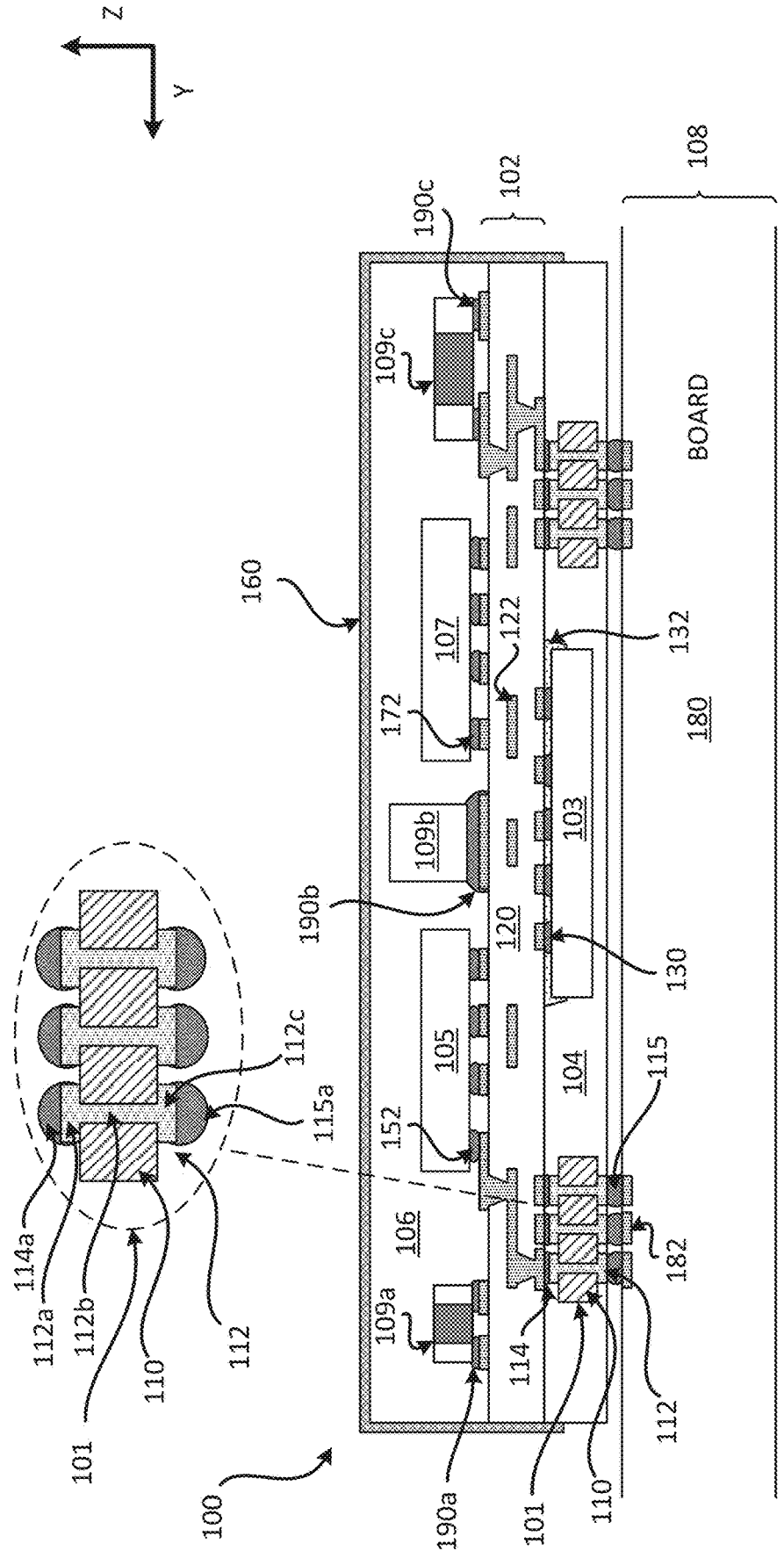
FIG. 1 illustrates an exemplary cross sectional profile view of a package that includes a substrate and at least one interconnection die.

FIG. 1 illustrates a cross sectional profile view of a package 100 that includes a substrate and a high density interconnection. The package 100 is coupled to a board 108 through a plurality of solder interconnects 115. The board 108 includes at least one board dielectric layer 180 and a plurality of board interconnects 182. The board 108 may include a printed circuit board (PCB).

The package 100 includes at least one interconnection die 101, a substrate 102, an integrated device 103, an integrated device 105, an integrated device 107, a passive device 109a, a passive device 109b, a passive device 109c, an encapsulation layer 104, an encapsulation layer 106, and an outer metal layer 160. The substrate 102 includes at least one dielectric layer 120 and a plurality of interconnects 122. The substrate 102 includes a first surface (e.g., bottom surface) and a second surface (e.g., top surface).

The integrated device 103 (e.g., first integrated device) is coupled to the first surface (e.g., bottom surface) of the substrate 102 through a plurality of solder interconnects 130.

The integrated device 103 may be coupled to the substrate 102 through a plurality of pillar interconnects (not shown) and the plurality of solder interconnects 130. There may be an underfill 132 between the integrated device 103 and the substrate 102. The at least one interconnection die 101 may be coupled to the first surface of the substrate 102 through a plurality of solder interconnects 114. As will be further described below, the at least one interconnection die 101 may be configured to provide high density interconnects for the package 100. The encapsulation layer 104 may be coupled to the first surface of the substrate 102. The encapsulation layer 104 may encapsulate (e.g., partial or complete) the integrated device 103 and the at least one interconnection die 101. The encapsulation layer 104 may include a mold, a resin and/or an epoxy. The encapsulation layer 104 may be a means for encapsulation. The encapsulation layer 104 may be provided by using a compression and transfer molding process, a sheet molding process, or a liquid molding process. The integrated device 103 may include a front side and a back side. The front side of the integrated device 103 may face the substrate 102. The back side of the integrated device 103 may face the board 108. The back side of the integrated device 103 may be covered by the encapsulation layer 104. In some implementations, the back side (e.g., back side surface) of the integrated device 103 may be left exposed (e.g., not covered by the encapsulation layer 104). An example of how the back side of the integrated device 103 may be exposed is illustrated and described below in FIG. 2.

The at least one interconnection die 101 includes a die substrate 110 and a plurality of die interconnects 112. The die substrate 110 may include silicon. The plurality of die interconnects 112 include a pad interconnect 112a (e.g., pad), a via interconnect 112b (e.g., via) and a pad interconnect 112c (e.g., pad). The pad interconnect 112a is coupled to the via interconnect 112b. The via interconnect 112b is coupled to the pad interconnect 112c. The pad interconnect 112a is coupled to the solder interconnect 114a. The solder interconnect 114a is part of the plurality of solder interconnects 114. The plurality of solder interconnects 114 is coupled to the plurality of die interconnects 112. The pad interconnect 112c is coupled to the solder interconnect 115a. The solder interconnect 115a is part of the plurality of solder interconnects 115. The at least one interconnection die 101 may be a dummy die. The interconnection die 101 may be free of any transistor. The at least one interconnection die 101 may be free of active components. The at least one interconnection die 101 may be a means for die interconnection.

The plurality of die interconnects 112 may have a pitch between neighboring die interconnects in a range of about 150-270 micrometers. The encapsulation layer 104 may have a thickness (e.g., height) in a range of about 150-300 micrometers. The plurality of solder interconnects 115 may have a diameter and/or a thickness of about 100 micrometers. The total combined thickness (e.g., height) of the plurality of solder interconnects 114, the at least one interconnection die 101 and the plurality of solder interconnects 115 may be in a range of about 250-400 micrometers. These dimensions are possible through the use of the at least one interconnection die 101, which (i) helps provide a package 100 that is thinner while still able to accommodate a bottom side integrated device (e.g., having adequate standoff height), and (ii) helps provide interconnects in an encapsulation layer with low pitches (e.g., 150-270 micrometers), and thus helps provide high-density routing (e.g., high-density interconnects) in an encapsulation layer.

The integrated device 105 (e.g., second integrated device) is coupled to a second surface (e.g., top surface) of the substrate 102 through a plurality of solder interconnects 152. For example, the integrated device 105 may be coupled to the plurality of interconnects 122 of the substrate 102 through the plurality of solder interconnects 152. The integrated device 105 may be coupled to the substrate 102 through a plurality of pillar interconnects (not shown) and the plurality of solder interconnects 152. The integrated device 107 (e.g., third integrated device) is coupled to the second surface of the substrate 102 through a plurality of solder interconnects 172. For example, the integrated device 107 may be coupled to the plurality of interconnects 122 of the substrate 102 through the plurality of solder interconnects 172. The integrated device 107 may be coupled to the substrate 102 through a plurality of pillar interconnects (not shown) and the plurality of solder interconnects 172. The passive device 109a is coupled to the second surface of the substrate 102 through a plurality of solder interconnects 190a. For example, the passive device 109a is coupled to the plurality of interconnects 122 of the substrate 102 through the plurality of solder interconnects 190a. The passive device 109b is coupled to the second surface of the substrate 102 through a plurality of solder interconnects 190b. For example, the passive device 109b is coupled to the plurality of interconnects 122 of the substrate 102 through the plurality of solder interconnects 190b. The passive device 109c is coupled to the second surface of the substrate 102 through a plurality of solder interconnects 190c. For example, the passive device 109c is coupled to the plurality of interconnects 122 of the substrate 102 through the plurality of solder interconnects 190c. A passive device (e.g., 109a, 109b, 109c) may include a capacitor and/or an inductor.

The encapsulation layer 106 is coupled to the second surface (e.g., top surface) of the substrate 102. The encapsulation layer 106 may encapsulate the integrated device 105, the integrated device 107, the passive device 109a, the passive device 109b and the passive device 109c. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process.

The outer metal layer 160 may be coupled to an outer surface of the encapsulation layer 106. The outer surface of the encapsulation layer 106 may include a top surface and a side surface. The outer metal layer 160 may also be coupled to a side surface of the substrate 102 and a side surface of the encapsulation layer 104. The outer metal layer 160 may be configured to be coupled to ground. The outer metal layer 160 may be configured to operate as an electromagnetic interference (EMI) shield for the package 100. The outer metal layer 160 may be configured to be coupled to one or more interconnects from the plurality of interconnects 122 of the substrate 102.

Figure 2:
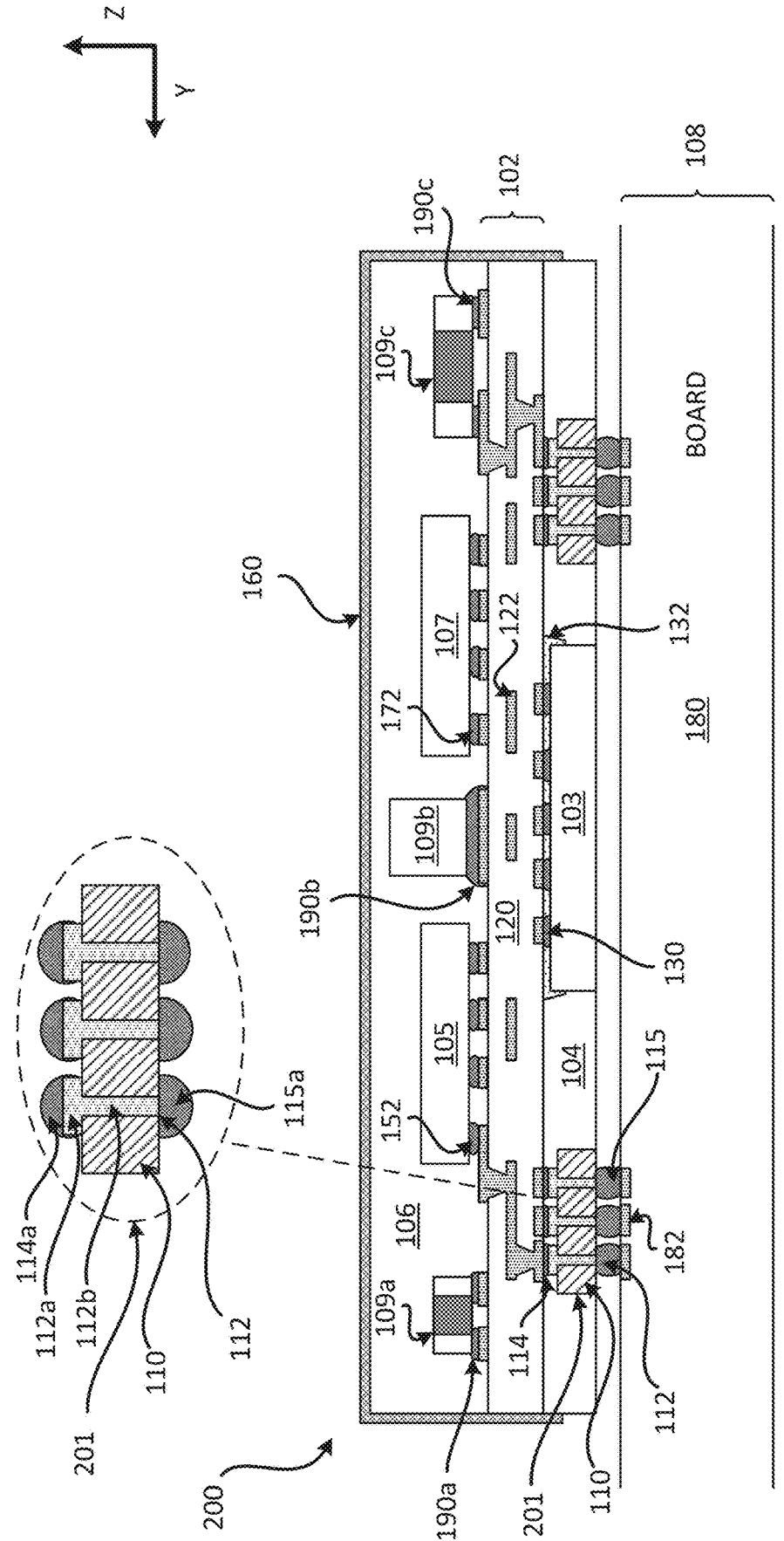
FIG. 2 illustrates an exemplary cross sectional profile view of a package that includes a substrate and at least one interconnection die.

FIG. 2 illustrates a cross sectional profile view of a package 200 that includes a substrate and a high density interconnection. The package 200 is similar to the package 100 of FIG. 1, and thus includes the same or similar components as the package 100. The package 200 includes at least one interconnection die 201 that has a different configuration as the at least one interconnection die 101 of FIG. 1.

The package 200 is coupled to the board 108 through a plurality of solder interconnects 115. The board 108 includes at least one board dielectric layer 180 and the plurality of board interconnects 182. The board 108 may include a printed circuit board (PCB).

The package 200 includes at least one interconnection die 201, the substrate 102, the integrated device 103, the integrated device 105, the integrated device 107, the passive device 109a, the passive device 109b, the passive device 109c, the encapsulation layer 104, the encapsulation layer 106, and the outer metal layer 160. The at least one interconnection die 201 is coupled to the first surface of the substrate 102 through the plurality of solder interconnects 114.

The at least one interconnection die 201 includes the die substrate 110 and the plurality of die interconnects 112. The die substrate 110 may include silicon. The plurality of die interconnects 112 include a pad interconnect 112a (e.g., pad) and a via interconnect 112b (e.g., via). The pad interconnect 112a is coupled to the via interconnect 112b. The pad interconnect 112a is coupled to the solder interconnect 114a. The solder interconnect 114a is part of the plurality of solder interconnects 114. The plurality of solder interconnects 114 is coupled to the plurality of die interconnects 112. The via interconnect 112b is coupled to the solder interconnect 115a. The solder interconnect 115a is part of the plurality of solder interconnects 115. The at least one interconnection die 101 may be a dummy die. Thus, one possible difference between the at least one interconnection die 201 and the at least one interconnection die 101 is that the at least one interconnection die 201 does not include a pad interconnect 112c. One advantage of not having the pad interconnect 112c is that the at least one interconnection die 201 may be thinner than the at least one interconnection die 101, which can help reduce the overall thickness of the package. The at least one interconnection die 201 may be a dummy die. The interconnection die 201 may be free of any transistor. The at least one interconnection die 201 may be free of active components. The at least one interconnection die 201 may be a means for die interconnection.

The plurality of die interconnects 112 of the at least one interconnection die 201, may have a pitch between neighboring die interconnects in a range of about 150-270 micrometers. The encapsulation layer 104 may have a thickness (e.g., height) in a range of about 150-300 micrometers. The plurality of solder interconnects 115 may have a diameter and/or a thickness of about 100 micrometers. The total combined thickness (e.g., height) of the plurality of solder interconnects 114, the at least one interconnection die 201 and the plurality of solder interconnects 115 may be in a range of about 250-400 micrometers. These dimensions are possible through the use of the at least one interconnection die 201, which (i) helps provide a package 200 that is thinner while still able to accommodate a bottom side integrated device (e.g., having adequate standoff height), and (ii) helps provide interconnects in an encapsulation layer with low pitches (e.g., 150-270 micrometers), and thus helps provide high-density routing (e.g., high-density interconnects) in an encapsulation layer.

Another difference between the package 200 and the package 100 is the back side of the integrated device 103 of the package 200 is exposed. As shown in FIG. 2, at least a portion of the back side of the integrated device 103 is not covered by the encapsulation layer 104. This may occur because during a fabrication process of the package 200, portions of the encapsulation layer 104, portions of the back side of the integrated device 103, and/or portions of the at least one interconnection die 201 may be removed during a grinding and/or polishing process of a bottom side of the package 200. However, it is noted that in some implementations of the package 200, the back side of the integrated device 103 may be covered by the encapsulation layer 104.

An integrated device (e.g., 103, 105, 107) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105, 107) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. A chiplet may be fabricated using a process that provides better yields compared to fabrication processes for other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Using several chiplets that performs several functions may reduce the overall cost of a package relative to using a single chip to perform all of the functions of a package.

The package (e.g., 100, 200) may be implemented in a radio frequency (RF) package. The RF package may be a radio frequency front end (RFFE) package. A package (e.g., 100, 200) may be configured to provide Wireless Fidelity (WiFi) communication and/or cellular communication (e.g., 2G, 3G, 4G, 5G). The packages (e.g., 100, 300) may be configured to support Global System for Mobile Communications (GSM), Universal Mobile Telecommunications System (UMTS), and/or Long-Term Evolution (LTE). The packages (e.g., 100, 200) may be configured to transmit and receive signals having different frequencies and/or communication protocols.

Having described various interconnection die, a sequence for fabricating an interconnection die will now be described below.

Exemplary Sequence for Fabricating an Interconnection Die

Figure 3B:
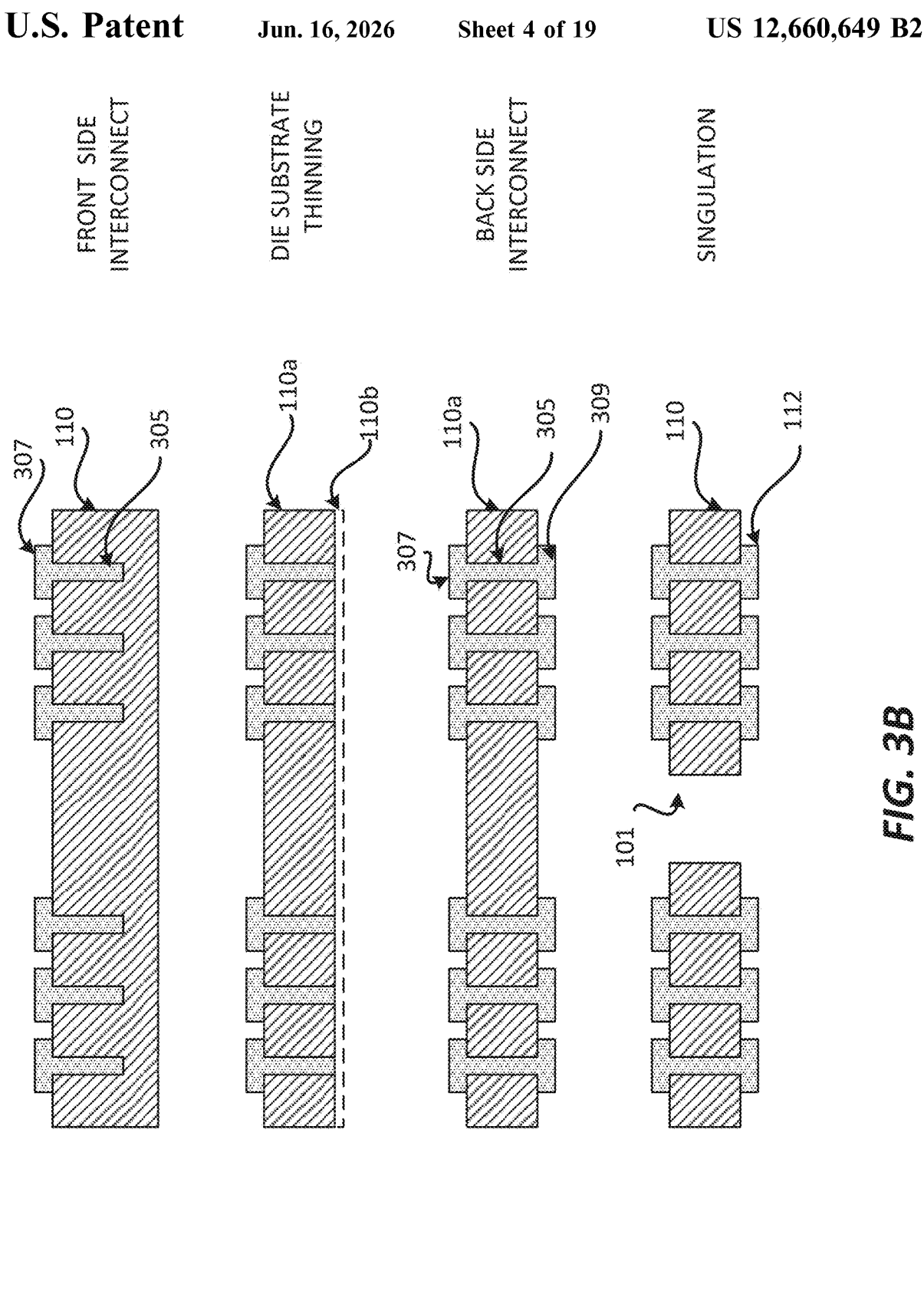

In some implementations, fabricating an interconnection die includes several processes. FIGS. 3A-3B illustrate an exemplary sequence for providing or fabricating an interconnection die. In some implementations, the sequence of FIGS. 3A-3B may be used to provide or fabricate the interconnection die 101. However, the process of FIGS. 3A-3B may be used to fabricate any of the interconnection die (e.g., 201) described in the disclosure.

It should be noted that the sequence of FIGS. 3A-3B may combine one or more stages in order to simplify and/or clarify the sequence for providing or fabricating an interconnection die. In some implementations, the order of the processes may be changed or modified. In some implementations, one or more of processes may be replaced or substituted without departing from the scope of the disclosure.

Stage 1, as shown in FIG. 3A, illustrates a state after a die substrate 110 is provided. The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface.

Stage 2 illustrates a state after a plurality of cavities 302 are formed in the die substrate 110. For example, the plurality of cavities 302 may be formed through the first surface of the die substrate 110. The plurality of cavities 302 may include trenches. The plurality of cavities 302 may extend partially through the thickness of the die substrate 110. A laser ablation process and/or an etching process may be used to form the plurality of cavities 302.

Stage 3 illustrates after a metal layer 305 is formed in the plurality of cavities 302 and/or over the first surface of the die substrate 110. The metal layer 305 may include copper. A plating process may be used to form the metal layer 305.

Stage 4 illustrates a state after portions of the metal layer 305 are removed. For example, portions of the metal layer 305 that are coupled to the first surface of the die substrate 110 may be removed, leaving the metal layer 305 in the plurality of cavities 302. A polishing process may be used to remove portions of the metal layer 305. The remaining metal from the metal layer 305 that is located in the plurality of cavities 302 may define a plurality of interconnects 112b, as described in FIG. 1 and FIG. 2.

Stage 5, as shown in FIG. 3B, illustrates a state after a metal layer 307 is formed over the first surface of the die substrate 110. A plating process may be used to form the metal layer 307. The metal layer 307 may be coupled to the metal layer 305. The metal layer 307 may define a plurality of interconnects 112a, as described in FIG. 1 and FIG. 2. The metal layer 307 may represent the front side interconnects of an interconnection die.

Stage 6 illustrates a state after the die substrate 110 is thinned. For example, portions of the die substrate 110 may be removed, leaving at least the die substrate 110a, which exposes the bottom side of the metal layer 305. In some implementations, portions of the die substrate 110 may be removed, leaving at least the die substrate 110a and the die substrate 110b. When the die substrate 110b is present, the bottom side of the metal layer 305 is not exposed. A grinding process may be used to remove portions of the die substrate 110. In some implementations, Stage 6 may illustrate one implementation of interconnection die that includes interconnects, and no additional interconnects are formed in, above or below the die substrate 110. If no further interconnects are formed, singulation may occur in a similar manner as described below at Stage 8. As will be further described below, the interconnection die that is shown in Stage 6 may be used to couple to a substrate.

Stage 7 illustrates a state after a metal layer 309 is formed over the second surface of the die substrate 110. A plating process may be used to form the metal layer 309. The metal layer 309 may be coupled to the metal layer 305. The metal layer 309 may define a plurality of interconnects 112c, as described in FIG. 1 and FIG. 2. The metal layer 309 may represent the back side interconnects of an interconnection die.

Stage 8 illustrates a state after singulation to form several interconnection dies. A mechanical process may be used to singulate the die substrate 110 into several interconnection dies (e.g., 101). A saw may be used to singulate the die substrate 110.

Exemplary Sequence for Fabricating an Interconnection Die

Figure 4B:
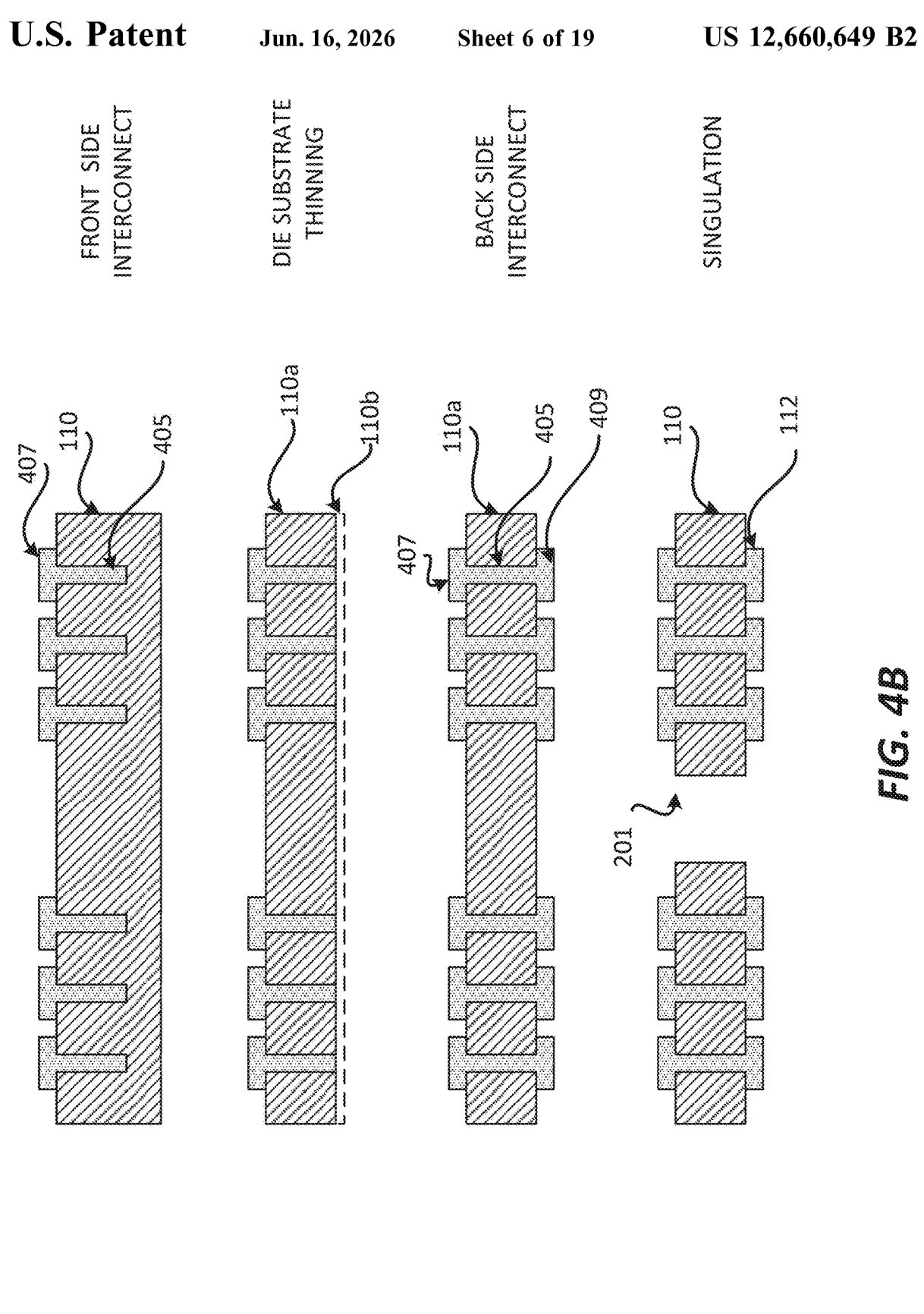

In some implementations, fabricating an interconnection die includes several processes. FIGS. 4A-4B illustrate an exemplary sequence for providing or fabricating an interconnection die. In some implementations, the sequence of FIGS. 4A-4B may be used to provide or fabricate the interconnection die 101. However, the process of FIGS. 4A-4B may be used to fabricate any of the interconnection die (e.g., 201) described in the disclosure.

It should be noted that the sequence of FIGS. 4A-4B may combine one or more stages in order to simplify and/or clarify the sequence for providing or fabricating an interconnection die. In some implementations, the order of the processes may be changed or modified. In some implementations, one or more of processes may be replaced or substituted without departing from the scope of the disclosure.

Stage 1, as shown in FIG. 4A, illustrates a state after a die substrate 110 is provided. The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface.

Stage 2 illustrates a state after a plurality of cavities 402 are formed in the die substrate 110. For example, the plurality of cavities 402 may be formed through the first surface of the die substrate 110. The plurality of cavities 402 may include trenches. The plurality of cavities 402 may extend partially through the thickness of the die substrate 110. A laser ablation process and/or an etching process may be used to form the plurality of cavities 402.

Stage 3 illustrates after a metal layer 405 is formed in the plurality of cavities 402 and/or over the first surface of the die substrate 110. The metal layer 405 may include copper. A fill process may be used to form the metal layer 405, where a conductive paste may be used to fill the plurality of cavities 402.

Stage 4 illustrates a state after portions of the metal layer 405 are removed. For example, portions of the metal layer 405 that are coupled to the first surface of the die substrate 110 may be removed, leaving the metal layer 405 in the plurality of cavities 402. A polishing process may be used to remove portions of the metal layer 405. The remaining metal from the metal layer 405 that is located in the plurality of cavities 402 may define a plurality of interconnects 112b, as described in FIG. 1 and FIG. 2.

Stage 5, as shown in FIG. 4B, illustrates a state after a metal layer 407 is formed over the first surface of the die substrate 110. A plating process may be used to form the metal layer 407. The metal layer 407 may be coupled to the metal layer 405. The metal layer 407 may define a plurality of interconnects 112a, as described in FIG. 1 and FIG. 2. The metal layer 407 may represent the front side interconnects of an interconnection die.

Stage 6 illustrates a state after the die substrate 110 is thinned. For example, portions of the die substrate 110 may be removed, leaving at least the die substrate 110a, which exposes the bottom side of the metal layer 405. In some implementations, portions of the die substrate 110 may be removed, leaving at least the die substrate 110a and the die substrate 110b. When the die substrate 110b is present, the bottom side of the metal layer 405 is not exposed. A grinding process may be used to remove portions of the die substrate 110. In some implementations, Stage 6 may illustrate one implementation of interconnection die that includes interconnects, and no additional interconnects are formed in, above or below the die substrate 110. If no further interconnects are formed, singulation may occur in a similar manner as described below at Stage 8. As will be further described below, the interconnection die that is shown in Stage 6 may be used to couple to a substrate.

Stage 7 illustrates a state after a metal layer 409 is formed over the second surface of the die substrate 110. A plating process may be used to form the metal layer 409. The metal layer 409 may be coupled to the metal layer 405. The metal layer 409 may define a plurality of interconnects 112c, as described in FIG. 1 and FIG. 2. The metal layer 409 may represent the back side interconnects of an interconnection die.

Stage 8 illustrates a state after singulation to form several interconnection dies. A mechanical process may be used to singulate the die substrate 110 into several interconnection dies (e.g., 101). A saw may be used to singulate the die substrate 110.

Exemplary Flow Diagram of a Method for Fabricating an Interconnection Die

In some implementations, fabricating an interconnection die includes several processes. FIG. 5 illustrates an exemplary flow diagram of a method 500 for providing or fabricating an interconnection die. In some implementations, the method 500 of FIG. 5 may be used to provide or fabricate the interconnection die 101 described in the disclosure. However, the method 500 may be used to provide or fabricate any of the interconnection die (e.g., 201) described in the disclosure.

It should be noted that the method 500 of FIG. 5 may combine one or more processes in order to simplify and/or clarify the method for providing or fabricating an interconnection die. In some implementations, the order of the processes may be changed or modified.

The method provides (at 505) a die substrate (e.g., 110). The die substrate 110 includes silicon. The die substrate 110 may include a first surface and a second surface. In some implementations, the first surface of the die substrate 110 may be a top surface and the second surface of the die substrate 110 may be a bottom surface. In some implementations, the first surface of the die substrate 110 may be a bottom surface and the second surface of the die substrate 110 may be a top surface. Stage 1 of FIG. 3A illustrates and describes an example of providing a die substrate. Stage 1 of FIG. 4A illustrates and describes an example of providing a die substrate.

The method forms (at 510) a plurality of cavities (e.g., 302, 402) in the die substrate 110. For example, the plurality of cavities (e.g., 302, 402) may be formed through the first surface of the die substrate 110. The plurality of cavities (e.g., 302, 402) may include trenches. The plurality of cavities (e.g., 302, 402) may extend partially through the thickness of the die substrate 110. A laser ablation process and/or an etching process may be used to form the plurality of cavities (e.g., 302, 402). Stage 2 of FIG. 3A illustrates and describes an example of forming cavities in a die substrate. Stage 2 of FIG. 4A illustrates and describes an example of forming cavities in a die substrate.

The method forms (at 515) a conductive material in the plurality of cavities (e.g., 302, 402) of the die substrate 110.

The conductive material may include a metal layer (e.g., 305, 405). The conductive material may be formed over the surface of the die substrate 110. The conductive material may include copper. A plating process may be used to form the conductive material. A fill process may be used to form the conductive material. Stage 3 of FIG. 3A illustrates and describes an example of forming conductive materials in a die substrate. Stage 3 of FIG. 4A illustrates and describes an example of forming conductive materials in a die substrate. In some implementations forming the conductive material may include removing portions of the conductive material. A polishing process may be used to remove portions of the conductive material. Removing portions of the conductive material may include removing portions of the conductive material that is coupled to the first surface of the die substrate 110 and leaving the conductive material that is located in the plurality of cavities (e.g., 302, 402) of the die substrate 110. Stage 4 of FIG. 3A illustrates and describes an example of removing portions of conductive materials in a die substrate. Stage 4 of FIG. 4A illustrates and describes an example of removing portions of conductive materials in a die substrate.

The method forms (at 520) a plurality of front side interconnects. The front side interconnects may be coupled to the top side of the die substrate 110. The plurality of front side interconnects may be defined by a patterned metal layer (e.g., 307, 407) on a top surface of the die substrate 110. A plating process may be used to form the metal layer (e.g., 307, 407). The metal layer 307 may be coupled to the metal layer 305. The metal layer 407 may be coupled to the metal layer 405. The metal layer 407 may define a plurality of interconnects 112b, as described in FIG. 1 and FIG. 2. The metal layer 407 may represent the front side interconnects of an interconnection die. The plurality of interconnects 112a may represent the plurality of front side interconnects of an interconnection die. Stage 5 of FIG. 3B illustrates and describes an example of forming front side interconnects. Stage 5 of FIG. 4B illustrates and describes an example of forming front side interconnects.

The method thins (at 525) the die substrate (e.g., 110). Different implementations may thin the die substrate 110 differently. For example, some implementations may thin the die substrate 110 such that a bottom side of the metal layer (e.g., 305, 405) is exposed. Some implementations may thin the die substrate 110 without exposing the bottom side of the metal layer (e.g., 305, 405). A grinding process may be used to remove portions of the die substrate 110. Stage 6 of FIG. 3B illustrates and describes an example of thinning a die substrate. Stage 6 of FIG. 4B illustrates and describes an example of thinning a die substrate.

The method optionally forms (at 530) a plurality of back side interconnects. The back side interconnects may be coupled to the bottom side of the die substrate 110. The plurality of back side interconnects may be defined by a patterned metal layer (e.g., 309, 409) on a top surface of the die substrate 110. A plating process may be used to form the metal layer (e.g., 309, 409). The metal layer 309 may be coupled to the metal layer 305. The metal layer 409 may be coupled to the metal layer 405. The metal layer 409 may define a plurality of interconnects 112c, as described in FIG. 1 and FIG. 2. The metal layer 409 may represent the back side interconnects of an interconnection die. The plurality of interconnects 112c may represent the plurality of back side interconnects of an interconnection die. Stage 7 of FIG. 3B illustrates and describes an example of forming back side interconnects. Stage 7 of FIG. 4B illustrates and describes an example of forming back side interconnects.

The method singulates (at 535) the die substrate 110 to form several interconnection dies (e.g., 101, 201). A mechanical process may be used to singulate the die substrate 110 into several interconnection dies (e.g., 101). A saw may be used to singulate the die substrate 110. Stage 8 of FIG. 3B illustrates and describes an example of singulation. Stage 8 of FIG. 4B illustrates and describes an example of singulation.

Exemplary Sequence for Fabricating a Package Comprising a Substrate and an Interconnection Die In some implementations, fabricating a package includes several processes. FIGS. 6A-6C illustrate an exemplary sequence for providing or fabricating a package. In some implementations, the sequence of FIGS. 6A-6C may be used to provide or fabricate the package 100. However, the process of FIGS. 6A-6C may be used to fabricate any of the packages (e.g., 200) described in the disclosure.

It should be noted that the sequence of FIGS. 6A-6C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 6A, illustrates a state after a substrate 102 is provided. The substrate 102 includes at least one dielectric layer 120 and a plurality of interconnects 122. The substrate 102 may include a first surface (e.g., bottom surface) and a second surface (e.g., top surface). The substrate 102 may be fabricated using the method as described in FIGS. 10A-10B. In some implementations, a cored substrate is provided (e.g., substrate that includes a core layer).

Stage 2 illustrates a state after an integrated device 103 is coupled to the first surface (e.g., bottom surface) of the substrate 102. The integrated device 103 may be coupled to the substrate 102 through the plurality of solder interconnects 130. A solder reflow process may be used to couple the integrated device 103 to the substrate 102. In some implementations, the integrated device 103 may be coupled to the substrate 102 through a plurality of pillar interconnects (not shown) and the plurality of solder interconnects 130. Stage 2 also illustrates a state after at least one interconnection die 101 is coupled to the first surface of the substrate 102. The at least one interconnection die 101 may be coupled to the substrate 102 through the plurality of solder interconnects 114. A solder reflow process may be used to couple the at least one interconnection die 101 to the substrate 102. Stage 2 also illustrates an underfill 132 that is provided and/or formed between the first integrated device 105 and the substrate 102.

Stage 3 illustrates a state after an encapsulation layer 104 is provided and coupled to the substrate 102. The encapsulation layer 104 may encapsulate the integrated device 103 and the at least one interconnection die 101. The encapsulation layer 104 may be coupled to the first surface of the substrate 102. The encapsulation layer 104 may include a mold, a resin and/or an epoxy. The encapsulation layer 104 may be a means for encapsulation. The encapsulation layer 104 may be provided by using a compression and transfer molding process, a sheet molding process, or a liquid molding process.

Stage 4 illustrates a state after portions of the encapsulation layer 104 is removed. A grinding process and/or a polishing process may be used to remove portions of the encapsulation layer 104. In some implementations, portions of the at least one interconnection die 101 and/or portions of the back side of the integrated device 103 may be removed as well.

Stage 5, as shown in FIG. 6B, illustrates a state after the integrated device 105, the integrated device 107 and the plurality of passive devices 109 (e.g., 109a, 109b, 109c) are coupled to the second surface (e.g., top surface) of the substrate 102. The integrated device 105 may be coupled to the substrate 102 through a plurality of pillar interconnects (not shown) and the plurality of solder interconnects 152. The integrated device 107 may be coupled to the substrate 102 through a plurality of pillar interconnects (not shown) and the plurality of solder interconnects 172. The plurality of passive devices 109 (e.g., 109a, 109b. 109c) may be coupled to the substrate 102 through a corresponding plurality of solder interconnects (e.g., 190a, 190b, 190c). A solder reflow process may be used to couple the integrated devices and/or the passive devices to the substrate 102.

Stage 6 illustrates a state after an encapsulation layer 106 is provided and coupled to the substrate 102. The encapsulation layer 106 may encapsulate the integrated devices (e.g., 105, 107) and passive devices (e.g., 109a, 109b, 109c). The encapsulation layer 106 may be coupled to the second surface of the substrate 102. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process.

Stage 7, as shown in FIG. 6C, illustrates a state after a plurality of solder interconnects 115 is coupled to the at least one interconnection die 101. A solder reflow process may be used to couple the plurality of solder interconnects 115 to the at least one interconnection die 101.

Stage 8 illustrates a state after an outer metal layer 160 is formed on an outer surface of the encapsulation layer 106. A sputtering process may be used to form the outer metal layer 160. The outer metal layer 160 may be formed on the top surface of the encapsulation layer 106, the side surface of the encapsulation layer 106, the side surface of the substrate 102 and/or the side surface of the encapsulation layer 104. Stage 8 may illustrate the package 100. The package 100 may be fabricated one at a time or may be fabricated together as part of one or more wafers and then singulated into individual packages.

Exemplary Flow Diagram of a Method for Fabricating a Package Comprising a Substrate and an Interconnection Die In some implementations, fabricating a package includes several processes. FIG. 7 illustrates an exemplary flow diagram of a method 700 for providing or fabricating a package. In some implementations, the method 700 of FIG. 7 may be used to provide or fabricate the package 100 described in the disclosure. However, the method 700 may be used to provide or fabricate any of the packages (e.g., 200) described in the disclosure.

It should be noted that the method 700 of FIG. 7 may combine one or more processes in order to simplify and/or clarify the method for providing or fabricating a package. In some implementations, the order of the processes may be changed or modified.

The method provides (at 705) a substrate (e.g., 102). The substrate 102 includes at least one dielectric layer 120 and a plurality of interconnects 122. The substrate 102 may include a first surface (e.g., bottom surface) and a second surface (e.g., top surface). The substrate 102 may be fabricated using the method as described in FIGS. 10A-10B. In some implementations, a cored substrate is provided (e.g., substrate that includes a core layer). Stage 1 of FIG. 6A illustrates and describes an example of providing a substrate.

The method couples (at 710) an integrated device (e.g., 103) and at least one interconnection die (e.g., 101) to the first surface (e.g., bottom surface) of the substrate 102. The integrated device 103 may be coupled to the substrate 102 through the plurality of solder interconnects 130. A solder reflow process may be used to couple the integrated device 103 to the substrate 102. The at least one interconnection die 101 may be coupled to the substrate 102 through the plurality of solder interconnects 114. A solder reflow process may be used to couple the at least one interconnection die 101 to the substrate 102. Stage 2 of FIG. 6A illustrates and describes an example of coupling an integrated device and an interconnection die to a substrate.

The method forms (at 715) an encapsulation layer (e.g., 104) that is coupled to the substrate (e.g., 102). The encapsulation layer 104 (e.g., first encapsulation layer) may encapsulate the integrated device 103 and the at least one interconnection die 101. The encapsulation layer 104 may be coupled to the first surface of the substrate 102. The encapsulation layer 104 may include a mold, a resin and/or an epoxy. The encapsulation layer 104 may be a means for encapsulation. The encapsulation layer 104 may be provided by using a compression and transfer molding process, a sheet molding process, or a liquid molding process. In some implementations, forming the encapsulation layer may include removing portions of the encapsulation layer 104. A grinding process and/or a polishing process may be used to remove portions of the encapsulation layer 104. In some implementations, portions of the at least one interconnection die 101 and/or portions of the back side of the integrated device 103 may be removed as well. Stages 3 and 4 of FIG. 6A illustrate and describe an example of providing an encapsulation layer and removing portions of an encapsulation layer.

The method couples (at 720) integrated devices (e.g., 105, 107) and passive devices (e.g., 109a, 109b, 109c) to the second surface (e.g., top surface) of the substrate 102. The integrated device 105 may be coupled to the substrate 102 through a plurality of pillar interconnects (not shown) and the plurality of solder interconnects 152. The integrated device 107 may be coupled to the substrate 102 through a plurality of pillar interconnects (not shown) and the plurality of solder interconnects 172. The plurality of passive devices 109 (e.g., 109a, 109b, 109c) may be coupled to the substrate 102 through a corresponding plurality of solder interconnects (e.g., 190a, 190b, 190c). A solder reflow process may be used to couple the integrated devices and/or the passive devices to the substrate 102. Stage 5 of FIG. 6B illustrates and describes an example of coupling an integrated device and a passive device to a substrate.

The method forms (at 725) an encapsulation layer (e.g., 106). The encapsulation layer is coupled to the substrate 102. The encapsulation layer 106 (e.g., second encapsulation layer) may encapsulate the integrated devices (e.g., 105, 107) and passive devices (e.g., 109a, 109b, 109c). The encapsulation layer 106 may be coupled to the second surface of the substrate 102. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. Stage 6 of FIG. 6B illustrates and describes an example of providing an encapsulation layer.

The method couples (at 730) a plurality of solder interconnects (e.g., 115) to the at least one interconnection die 101. A solder reflow process may be used to couple the plurality of solder interconnects 115 to the at least one interconnection die 101. Stage 7 of FIG. 6C illustrates and describes an example of coupling solder interconnects to a substrate.

The method forms (at 735) an outer metal layer (e.g., 160) on an outer surface of the encapsulation layer 106. A sputtering process may be used to form the outer metal layer 160. The outer metal layer 160 may be formed on the top surface of the encapsulation layer 106, the side surface of the encapsulation layer 106, the side surface of the substrate 102 and/or the side surface of the encapsulation layer 104. The outer metal layer 160 may be coupled to an interconnect from the plurality of interconnects 122 of the substrate 102. The outer metal layer 160 may be configured to operate as an electromagnetic interference (EMI) shield for the package 100. Stage 8 of FIG. 6C illustrates and describes an example of forming an outer metal layer.

In some implementations, several packages are fabricated at the same time. In such cases, the method may singulate the package (e.g., 100, 200).

Exemplary Sequence for Fabricating a Package Comprising a Substrate and an Interconnection Die In some implementations, fabricating a package includes several processes. FIGS. 8A-8C illustrate an exemplary sequence for providing or fabricating a package. In some implementations, the sequence of FIGS. 8A-8C may be used to provide or fabricate the package 200. However, the process of FIGS. 8A-8C may be used to fabricate any of the packages (e.g., 100) described in the disclosure.

It should be noted that the sequence of FIGS. 8A-8C may combine one or more stages in order to simplify and/or clarify the sequence for providing or fabricating a package. In some implementations, the order of the processes may be changed or modified. In some implementations, one or more of processes may be replaced or substituted without departing from the scope of the disclosure.

Stage 1, as shown in FIG. 8A, illustrates a state after a substrate 102 is provided. The substrate 102 includes at least one dielectric layer 120 and a plurality of interconnects 122. The substrate 102 may include a first surface (e.g., bottom surface) and a second surface (e.g., top surface). The substrate 102 may be fabricated using the method as described in FIGS. 10A-10B. In some implementations, a cored substrate is provided (e.g., substrate that includes a core layer).

Stage 2 illustrates a state after the integrated device 105, the integrated device 107 and the plurality of passive devices 109 (e.g., 109a, 109b, 109c) are coupled to the second surface (e.g., top surface) of the substrate 102. The integrated device 105 may be coupled to the substrate 102 through a plurality of pillar interconnects (not shown) and the plurality of solder interconnects 152. The integrated device 107 may be coupled to the substrate 102 through a plurality of pillar interconnects (not shown) and the plurality of solder interconnects 172. The plurality of passive devices 109 (e.g., 109a, 109b, 109c) may be coupled to the substrate 102 through a corresponding plurality of solder interconnects (e.g., 190a, 190b, 190c). A solder reflow process may be used to couple the integrated devices and/or the passive devices to the substrate 102.

Stage 3 illustrates a state after an encapsulation layer 106 is provided and coupled to the substrate 102. The encapsulation layer 106 (e.g., second encapsulation layer) may encapsulate the integrated devices (e.g., 105, 107) and passive devices (e.g., 109a, 109b, 109c). The encapsulation layer 106 may be coupled to the second surface of the substrate 102. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process.

Stage 4, as shown in FIG. 8B, illustrates a state after an integrated device 103 is coupled to the first surface (e.g., bottom surface) of the substrate 102. The integrated device 103 may be coupled to the substrate 102 through the plurality of solder interconnects 130. The integrated device 103 may be coupled to the substrate 102 through a plurality of pillar interconnects (not shown) and the plurality of solder interconnects 130. A solder reflow process may be used to couple the integrated device 103 to the substrate 102. Stage 2 also illustrates a state after at least one interconnection die 201 is coupled to the first surface of the substrate 102. The at least one interconnection die 201 may be coupled to the substrate 102 through the plurality of solder interconnects 114. A solder reflow process may be used to couple the at least one interconnection die 201 to the substrate 102. Stage 2 also illustrates an underfill 132 that is provided and/or formed between the first integrated device 105 and the substrate 102.

Stage 5 illustrates a state after an encapsulation layer 104 (e.g., first encapsulation layer) is provided and coupled to the substrate 102. The encapsulation layer 104 may encapsulate the integrated device 103 and the at least one interconnection die 201. The encapsulation layer 104 may be coupled to the first surface of the substrate 102. The encapsulation layer 104 may include a mold, a resin and/or an epoxy. The encapsulation layer 104 may be a means for encapsulation. The encapsulation layer 104 may be provided by using a compression and transfer molding process, a sheet molding process, or a liquid molding process.

Stage 6 illustrates a state after portions of the encapsulation layer 104 is removed. A grinding process and/or a polishing process may be used to remove portions of the encapsulation layer 104. Portions of the at least one interconnection die 201 and/or portions of the back side of the integrated device 103 may be removed as well. Removing portions of the interconnection die 201 may remove portions of the die substrate 110, which may expose interconnects in the die substrate 110.

Stage 7, as shown in FIG. 8C, illustrates a state after a plurality of solder interconnects 115 is coupled to the at least one interconnection die 201. A solder reflow process may be used to couple the plurality of solder interconnects 115 to the at least one interconnection die 201.

Stage 8 illustrates a state after an outer metal layer 160 is formed on an outer surface of the encapsulation layer 106. A sputtering process may be used to form the outer metal layer 160. The outer metal layer 160 may be formed on the top surface of the encapsulation layer 106, the side surface of the encapsulation layer 106, the side surface of the substrate 102 and/or the side surface of the encapsulation layer 104. Stage 8 may illustrate the package 200. The package 200 may be fabricated one at a time or may be fabricated together as part of one or more wafers and then singulated into individual packages.

Exemplary Flow Diagram of a Method for Fabricating a Package Comprising a Substrate and an Interconnection Die In some implementations, fabricating a package includes several processes. FIG. 9 illustrates an exemplary flow diagram of a method 900 for providing or fabricating a package. In some implementations, the method 900 of FIG.

9 may be used to provide or fabricate the package 200 described in the disclosure. However, the method 900 may be used to provide or fabricate any of the packages (e.g., 100) described in the disclosure.

It should be noted that the method 900 of FIG. 9 may combine one or more processes in order to simplify and/or clarify the method for providing or fabricating a package. In some implementations, the order of the processes may be changed or modified.

The method provides (at 905) a substrate (e.g., 102). The substrate 102 includes at least one dielectric layer 120 and a plurality of interconnects 122. The substrate 102 may include a first surface (e.g., bottom surface) and a second surface (e.g., top surface). The substrate 102 may be fabricated using the method as described in FIGS. 10A-10B. In some implementations, a cored substrate is provided (e.g., substrate that includes a core layer). Stage 1 of FIG. 8A illustrates and describes an example of providing a substrate.

The method couples (at 910) integrated devices (e.g., 105, 107) and passive devices (e.g., 109a, 109b, 109c) to the second surface (e.g., top surface) of the substrate 102. The integrated device 105 may be coupled to the substrate 102 through a plurality of pillar interconnects (not shown) and the plurality of solder interconnects 152. The integrated device 107 may be coupled to the substrate 102 through a plurality of pillar interconnects (not shown) and the plurality of solder interconnects 172. The plurality of passive devices 109 (e.g., 109a, 109b, 109c) may be coupled to the substrate 102 through a corresponding plurality of solder interconnects (e.g., 190a, 190b, 190c). A solder reflow process may be used to couple the integrated devices and/or the passive devices to the substrate 102. Stage 2 of FIG. 8A illustrates and describes an example of coupling an integrated device and a passive device to a substrate.

The method forms (at 915) an encapsulation layer (e.g., 106). The encapsulation layer is coupled to the substrate 102. The encapsulation layer 106 (e.g., second encapsulation layer) may encapsulate the integrated devices (e.g., 105, 107) and passive devices (e.g., 109a, 109b, 109c). The encapsulation layer 106 may be coupled to the second surface of the substrate 102. The encapsulation layer 106 may include a mold, a resin and/or an epoxy. The encapsulation layer 106 may be a means for encapsulation. The encapsulation layer 106 may be provided by using a compression and transfer molding process, a sheet molding process, or a liquid molding process. Stage 3 of FIG. 8A illustrates and describes an example of providing an encapsulation layer.

The method couples (at 920) an integrated device (e.g., 103) and at least one interconnection die (e.g., 101) to the first surface (e.g., bottom surface) of the substrate 102. The integrated device 103 may be coupled to the substrate 102 through the plurality of solder interconnects 130. The integrated device 103 may be coupled to the substrate 102 through a plurality of pillar interconnects (not shown) and the plurality of solder interconnects 130. A solder reflow process may be used to couple the integrated device 103 to the substrate 102. The at least one interconnection die 101 may be coupled to the substrate 102 through the plurality of solder interconnects 114. A solder reflow process may be used to couple the at least one interconnection die 101 to the substrate 102. Stage 4 of FIG. 8B illustrates and describes an example of coupling an integrated device and an interconnection die to a substrate.

The method forms (at 925) an encapsulation layer (e.g., 104) that is coupled to the substrate (e.g., 102). The encapsulation layer 104 (e.g., first encapsulation layer) may encapsulate the integrated device 103 and the at least one interconnection die 101. The encapsulation layer 104 may be coupled to the first surface of the substrate 102. The encapsulation layer 104 may include a mold, a resin and/or an epoxy. The encapsulation layer 104 may be a means for encapsulation. The encapsulation layer 104 may be provided by using a compression and transfer molding process, a sheet molding process, or a liquid molding process. In some implementations, forming the encapsulation layer may include removing portions of the encapsulation layer 104. A grinding process and/or a polishing process may be used to remove portions of the encapsulation layer 104. In some implementations, portions of the at least one interconnection die 101 and/or portions of the back side of the integrated device 103 may be removed as well. Stages 5 and 6 of FIG. 8B illustrate and describe an example of providing an encapsulation layer and removing portions of an encapsulation layer.

The method couples (at 930) a plurality of solder interconnects (e.g., 115) to the at least one interconnection die 101. A solder reflow process may be used to couple the plurality of solder interconnects 115 to the at least one interconnection die 101. Stage 7 of FIG. 8C illustrates and describes an example of coupling solder interconnects to a substrate.

The method forms (at 735) an outer metal layer (e.g., 160) on an outer surface of the encapsulation layer 106. A sputtering process may be used to form the outer metal layer 160. The outer metal layer 160 may be formed on the top surface of the encapsulation layer 106, the side surface of the encapsulation layer 106, the side surface of the substrate 102 and/or the side surface of the encapsulation layer 104. Stage 8 of FIG. 8C illustrates and describes an example of forming an outer metal layer.

In some implementations, several packages are fabricated at the same time. In such cases, the method may singulate the package (e.g., 100, 201).

Exemplary Sequence for Fabricating a Substrate

In some implementations, fabricating a substrate includes several processes. FIGS. 10A-10B illustrate an exemplary sequence for providing or fabricating a substrate. In some implementations, the sequence of FIGS. 10A-10B may be used to provide or fabricate the substrate 102. However, the process of FIGS. 10A-10B may be used to fabricate any of the substrates described in the disclosure.

It should be noted that the sequence of FIGS. 10A-10B may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Stage 1, as shown in FIG. 10A, illustrates a state after a carrier 1000 is provided. A seed layer 1001 and interconnects 1002 may be located over the carrier 1000. The interconnects 1002 may be located over the seed layer 1001. A plating process and etching process may be used to form the interconnects 1002. In some implementations, the carrier 1000 may be provided with the seed layer 1001 and a metal layer that is patterned to form the interconnects 1002. The interconnects 1002 may represent at least some of the interconnects from the plurality of interconnects 142.

Stage 2 illustrates a state after a dielectric layer 1020 is formed over the carrier 1000, the seed layer 1001 and the interconnects 1002. A deposition and/or lamination process may be used to form the dielectric layer 1020. The dielectric layer 1020 may include prepreg and/or polyimide. The dielectric layer 1020 may include a photo-imagable dielectric. However, different implementations may use different materials for the dielectric layer.

Stage 3 illustrates a state after a plurality of cavities 1010 is formed in the dielectric layer 1020. The plurality of cavities 1010 may be formed using an etching process (e.g., photo etching process) or laser process.

Stage 4 illustrates a state after interconnects 1012 are formed in and over the dielectric layer 1020, including in and over the plurality of cavities 1010. For example, a via, pad and/or traces may be formed. A plating process may be used to form the interconnects.

Stage 5 illustrates a state after a dielectric layer 1022 is formed over the dielectric layer 1020 and the interconnects 1012. A deposition and/or lamination process may be used to form the dielectric layer 1022. The dielectric layer 1022 may include prepreg and/or polyimide. The dielectric layer 1022 may include a photo-imagable dielectric. However, different implementations may use different materials for the dielectric layer.

Stage 6, as shown in FIG. 10B, illustrates a state after a plurality of cavities 1030 is formed in the dielectric layer 1022. The plurality of cavities 1030 may be formed using an etching process (e.g., photo etching process) or laser process.

Stage 7 illustrates a state after interconnects 1014 are formed in and over the dielectric layer 1022, including in and over the plurality of cavities 1030. For example, a via, pad and/or traces may be formed. A plating process may be used to form the interconnects.

Stage 8 illustrates a state after the carrier 1000 is decoupled (e.g., detached, removed, grinded out) from at least one dielectric layer 140 and the seed layer 1001, portions of the seed layer 1001 are removed (e.g., etched out), leaving the substrate 102 that includes at least one dielectric layer 120 and the plurality of interconnects 122. The at least one dielectric layer 120 may represent the dielectric layer 1020 and/or the dielectric layer 1022. The plurality of interconnects 122 may represent the interconnects 1002, 1012 and/or 1014.

Different implementations may use different processes for forming the metal layer(s) and/or interconnects. In some implementations, a chemical vapor deposition (CVD) process, a physical vapor deposition (PVD) process, a sputtering process, a spray coating process, and/or a plating process may be used to form the metal layer(s).

Exemplary Flow Diagram of a Method for Fabricating a Substrate

In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate(s) of the disclosure. For example, the method 1100 of FIG. 11 may be used to fabricate the substrate 102.

It should be noted that the method 1100 of FIG. 11 may combine one or more processes in order to simplify and/or clarify the method for providing or fabricating a substrate. In some implementations, the order of the processes may be changed or modified.

The method provides (at 1105) a carrier (e.g., 1000). Different implementations may use different materials for the carrier 1000. The carrier 1000 may include a seed layer (e.g., 1001). The seed layer 1001 may include a metal (e.g., copper). The carrier may include a substrate, glass, quartz and/or carrier tape. Stage 1 of FIG. 10A illustrates and describes an example of a carrier with a seed layer that is provided.

The method forms and patterns (at 1110) interconnects over the carrier 1000 and the seed layer 1001. A metal layer may be patterned to form interconnects. A plating process may be used to form the metal layer and interconnects. In some implementations, the carrier and seed layer may include a metal layer. The metal layer is located over the seed layer and the metal layer may be patterned to form interconnects (e.g., 142). Stage 1 of FIG. 10A illustrates and describes an example of forming and patterning interconnects over a seed layer and a carrier.

The method forms (at 1115) a dielectric layer 1020 over the seed layer 1001, the carrier 1000 and the interconnects 1002. A deposition and/or lamination process may be used to form the dielectric layer 1020. The dielectric layer 1020 may include prepreg and/or polyimide. The dielectric layer 1020 may include a photo-imageable dielectric. Forming the dielectric layer 1020 may also include forming a plurality of cavities (e.g., 1010) in the dielectric layer 1020. The plurality of cavities may be formed using an etching process (e.g., photo etching) or laser process. Stages 2-3 of FIG. 10A illustrate and describe an example of forming a dielectric layer and cavities in the dielectric layer.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Forming interconnects may also include forming interconnects in cavities of the dielectric layer. Stage 4 of FIG. 10A illustrates and describes an example of forming interconnects in and over a dielectric layer.

The method forms (at 1125) a dielectric layer 1022 over the dielectric layer 1020 and the interconnects 1012. A deposition and/or lamination process may be used to form the dielectric layer 1022. The dielectric layer 1022 may include prepreg and/or polyimide. The dielectric layer 1022 may include a photo-imageable dielectric. Forming the dielectric layer 1022 may also include forming a plurality of cavities (e.g., 1030) in the dielectric layer 1022. The plurality of cavities may be formed using an etching process (e.g., photo etching) or laser process. Stages 5-6 of FIGS. 10A-10B illustrate and describe an example of forming a dielectric layer and cavities in the dielectric layer.

The method forms (at 1130) interconnects in and over the dielectric layer. For example, the interconnects 1014 may be formed in and over the dielectric layer 1022. A plating process may be used to form the interconnects. Forming interconnects may include providing a patterned metal layer over and/or in the dielectric layer. Forming interconnects may also include forming interconnects in cavities of the dielectric layer. Forming interconnects may include forming post interconnects. Stage 7 of FIG. 10B illustrates and describes an example of forming interconnects in and over a dielectric layer, including forming post interconnects.

The method decouples (at 1135) the carrier (e.g., 1000) from the seed layer (e.g., 1001). The carrier 1000 may be detached and/or grinded off. The method may also remove (at 1135) portions of the seed layer (e.g., 1001). An etching process may be used to remove portions of the seed layer 1001. Stage 8 of FIG. 10B illustrates and describes an example of decoupling a carrier and seed layer removal.

Different implementations may use different processes for forming the metal layer(s). In some implementations, a chemical vapor deposition (CVD) process, a physical vapor deposition (PVD) process, a sputtering process, a spray coating process, and/or a plating process may be used to form the metal layer(s).

Exemplary Electronic Devices

FIG. 12 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1202, a laptop computer device 1204, a fixed location terminal device 1206, a wearable device 1208, or automotive vehicle 1210 may include a device 1200 as described herein. The device 1200 may be, for example, any of the devices and/or integrated circuit (IC) packages described herein. The devices 1202, 1204, 1206 and 1208 and the vehicle 1210 illustrated in FIG. 12 are merely exemplary. Other electronic devices may also feature the device 1200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-2, 3A-3B, 4A-4B, 5, 6A-6C, 7, 8A-8C, 9, 10A-10B and 11-12 may be rearranged and/or combined into a single component, process, feature or function or embodied in several components, processes, or functions. Additional elements, components, processes, and/or functions may also be added without departing from the disclosure. It should also be noted FIGS. 1-2, 3A-3B, 4A-4B, 5, 6A-6C, 7, 8A-8C, 9, 10A-10B and 11-12 and its corresponding description in the present disclosure is not limited to dies and/or ICs. In some implementations, FIGS. 1-2, 3A-3B, 4A-4B, 5, 6A-6C, 7, 8A-8C, 9, 10A-10B and 11-12 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

Aspect 1: A package comprising a substrate comprising a first surface and a second surface; a first integrated device coupled to the first surface of the substrate; an interconnection die coupled to the first surface of the substrate; a first encapsulation layer coupled to the first surface of the substrate, wherein the first encapsulation layer encapsulates the first integrated device and the interconnection die; and a second integrated device coupled to the second surface of the substrate.

Aspect 2: The package of aspect 1, wherein the interconnection die comprises a die substrate; and a plurality of die interconnects.

Aspect 3: The package of aspect 2, wherein two neighboring die interconnects from the plurality of die interconnects have a pitch in a range of about 150-270 micrometers.

Aspect 4: The package of aspects 1 through 3, wherein the interconnection die has a thickness in a range of about 100-200 micrometers.

Aspect 5: The package of aspects 2 through 4, wherein the plurality of die interconnects includes a via die interconnect and a pad die interconnect.

Aspect 6: The package of aspects 2 through 5, wherein the die substrate includes glass and/or silicon.

Aspect 7: The package of aspects 1 through 6, further comprising a second encapsulation layer coupled to the second surface of the substrate.

Aspect 8: The package of aspect 7, further comprising an outer metal layer coupled to the second encapsulation layer.

Aspect 9: The package of aspects 1 through 8, wherein the first integrated device includes a first chiplet and the second integrated device includes a second chiplet.

Aspect 10: The package of aspects 1 through 9, wherein the interconnection die is located laterally to the first integrated device.

Aspect 11: The package of aspects 1 through 10, wherein the first integrated device includes a first chiplet and the second integrated device includes a second chiplet.

Aspect 12: A device comprising a package. The package comprising a substrate comprising a first surface and a second surface; a first integrated device coupled to the first surface of the substrate; an interconnection die coupled to the first surface of the substrate; a first encapsulation layer coupled to the first surface of the substrate, wherein the first encapsulation layer encapsulates the first integrated device and the interconnection die; and a second integrated device coupled to the second surface of the substrate.

Aspect 13: The device of aspect 12, wherein the interconnection die comprises a die substrate; and a plurality of die interconnects.

Aspect 14: The device of aspect 13, wherein two neighboring die interconnects from the plurality of die interconnects have a pitch in a range of about 150-270 micrometers.

Aspect 15: The device of aspects 12 through 14, wherein the interconnection die has a thickness in a range of about 100-200 micrometers.

Aspect 16: The device of aspects 13 through 15, wherein the plurality of die interconnects includes a via die interconnect and a pad die interconnect.

Aspect 17: The device of aspects 13 through 16, wherein the die substrate includes glass and/or silicon.

Aspect 18: The device of aspects 12 through 17, further comprising a second encapsulation layer coupled to the second surface of the substrate.

Aspect 19: The device of aspect 18, further comprising an outer metal layer coupled to the second encapsulation layer.

Aspect 20: The device of aspects 12 through 19, wherein the first integrated device includes a first chiplet and the second integrated device includes a second chiplet.

Aspect 21: The device of aspects 12 through 20, wherein the interconnection die is located laterally to the first integrated device.

Aspect 22: The device of aspects 12 through 21, wherein the first integrated device includes a first chiplet and the second integrated device includes a second chiplet.

Aspect 23: The device of aspects 12 through 22, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 24: A method for fabricating a package. The method provides a substrate comprising a first surface and a second surface. The method couples a first integrated device to the first surface of the substrate. The method couples an interconnection die to the first surface of the substrate. The method couples a first encapsulation layer to the first surface of the substrate, wherein the first encapsulation layer encapsulates the first integrated device and the interconnection die. The method couples a second integrated device to the second surface of the substrate.

Aspect 25: The method of aspect 24, wherein the interconnection die comprises a die substrate; and a plurality of die interconnects.

Aspect 26: The method of aspect 25, wherein two neighboring die interconnects from the plurality of die interconnects have a pitch in a range of about 150-270 micrometers.

Aspect 27: The method of aspects 24 through 26, wherein the interconnection die has a thickness in a range of about 100-200 micrometers.

Aspect 28: The method of aspects 25 through 27, wherein the plurality of die interconnects includes a via die interconnect and a pad die interconnect.

Aspect 29: The method of aspects 25 through 28, wherein the die substrate includes glass and/or silicon.

Aspect 30: The method of aspects 24 through 29, further comprising coupling a second encapsulation layer to the second surface of the substrate.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
a substrate comprising a first surface and a second surface;
a first integrated device coupled to the first surface of the substrate;
an interconnection die coupled to the first surface of the substrate through a first plurality of solder interconnects,
   wherein the first plurality of solder interconnects are coupled to and touching (i) a first side of the interconnection die and (ii) the substrate,
   wherein the first side of the interconnection die faces in a direction of the substrate, and
   wherein the interconnection die includes a pad die interconnect;
a second plurality of solder interconnects coupled to and touching a second side of the interconnection die, wherein the second side of the interconnection die is opposite to the first side of the interconnection die;
a first encapsulation layer coupled to the first surface of the substrate,
   wherein the first encapsulation layer at least partially encapsulates the first integrated device, the interconnection die, and the pad die interconnect; and
a second integrated device coupled to the second surface of the substrate.

2. The package of claim 1, wherein the interconnection die comprises:
a die substrate; and
a plurality of die interconnects including:
   a via die interconnect that extends vertically through the entire die substrate; and
   the pad die interconnect coupled to the via die interconnect.

3. The package of claim 2, wherein two neighboring die interconnects from the plurality of die interconnects have a pitch in a range of 150-270 micrometers.

4. The package of claim 2, wherein the interconnection die has a thickness in a range of 100-200 micrometers.

5. The package of claim 2,
wherein the interconnection die includes a plurality of pad die interconnects comprising the pad die interconnect,
wherein the plurality of die interconnects include a plurality of via interconnects comprising the via die interconnect, and
wherein the plurality of pad die interconnects are coupled to and touch the first plurality of solder interconnects.

6. The package of claim 2, wherein the die substrate includes glass and/or silicon.

7. The package of claim 1, further comprising a second encapsulation layer coupled to the second surface of the substrate.

8. The package of claim 7, further comprising an outer metal layer coupled to the second encapsulation layer.

9. The package of claim 1, wherein the first integrated device includes a first chiplet and the second integrated device includes a second chiplet.

10. The package of claim 1, wherein the interconnection die is located laterally to the first integrated device.

11. The package of claim 1, wherein the first integrated device includes a first chiplet and the second integrated device includes a second chiplet.

12. A device comprising:

a package comprising:

a substrate comprising a first surface and a second surface;

a first integrated device coupled to the first surface of the substrate;

an interconnection die coupled to the first surface of the substrate through a first plurality of solder interconnects, wherein the first plurality of solder interconnects are coupled to and touching (i) a first side of the interconnection die and (ii) the substrate, wherein the first side of the interconnection die faces in a direction of the substrate, and wherein the interconnection die includes a pad die interconnect;

a second plurality of solder interconnects coupled to and touching a second side of the interconnection die, wherein the second side of the interconnection die is opposite to the first side of the interconnection die;

a first encapsulation layer coupled to the first surface of the substrate, wherein the first encapsulation layer at least partially encapsulates the first integrated device, the interconnection die, and the pad die interconnect; and a second integrated device coupled to the second surface of the substrate.

13. The device of claim 12, wherein the interconnection die comprises:

a die substrate; and a plurality of die interconnects including:

a via die interconnect that extends vertically through the entire die substrate; and the pad die interconnect coupled to the via die interconnect.

14. The device of claim 13, wherein two neighboring die interconnects from the plurality of die interconnects have a pitch in a range of 150-270 micrometers.

15. The device of claim 13, wherein the interconnection die has a thickness in a range of 100-200 micrometers.

16. The device of claim 13, wherein the interconnection die includes a plurality of pad die interconnects comprising the pad die interconnect, wherein the plurality of die interconnects include a plurality of via die interconnects comprising the via die interconnect, and wherein the plurality of pad die interconnects are coupled to and touch the first plurality of solder interconnects.

17. The device of claim 13, wherein the die substrate includes glass and/or silicon.

18. The device of claim 12, further comprising a second encapsulation layer coupled to the second surface of the substrate.

19. The device of claim 18, further comprising an outer metal layer coupled to the second encapsulation layer.

20. The device of claim 12, wherein the first integrated device includes a first chiplet and the second integrated device includes a second chiplet.

21. The device of claim 12, wherein the interconnection die is located laterally to the first integrated device, wherein the device further comprises a board coupled to the package through the second plurality of solder interconnects.

22. The device of claim 12, wherein the first integrated device includes a first chiplet and the second integrated device includes a second chiplet.

23. The device of claim 12, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

24. A method for fabricating a package, comprising:

providing a substrate comprising a first surface and a second surface;

coupling a first integrated device to the first surface of the substrate;

coupling an interconnection die to the first surface of the substrate through a first plurality of solder interconnects, wherein the first plurality of solder interconnects are coupled to and touching (i) a first side of the interconnection die and (ii) the substrate, wherein the first side of the interconnection die faces in a direction of the substrate, wherein a second plurality of solder interconnects are coupled to and touching a second side of the interconnection die, wherein the second side of the interconnection die is opposite to the first side of the interconnection die, wherein the interconnection die includes a pad die interconnect;

coupling a first encapsulation layer to the first surface of the substrate, wherein the first encapsulation layer at least partially encapsulates the first integrated device, the interconnection die, and the pad die interconnect; and coupling a second integrated device to the second surface of the substrate.

25. The method of claim 24, wherein the interconnection die comprises:

a die substrate; and a plurality of die interconnects including:

a via die interconnect that extends vertically through the entire die substrate; and the pad die interconnect coupled to the via die interconnect.

26. The method of claim 25, wherein two neighboring die interconnects from the plurality of die interconnects have a pitch in a range of about 150-270 micrometers.

27. The method of claim 25, wherein the interconnection die has a thickness in a range of about 100-200 micrometers.

28. The method of claim 25, wherein the interconnection die includes a plurality of pad die interconnects comprising the pad die interconnect, wherein the plurality of die interconnects include a plurality of via die interconnects comprising the via die interconnect, and wherein the plurality of pad die interconnects are coupled to and touch the first plurality of solder interconnects.

29. The method of claim 25, wherein the die substrate includes glass and/or silicon.

30. The method of claim 24, further comprising coupling a second encapsulation layer to the second surface of the substrate.

* * * * *